United States Patent
Lin et al.

(10) Patent No.: US 11,984,490 B2
(45) Date of Patent: May 14, 2024

(54) SCHOTTKY BARRIER DIODE WITH REDUCED LEAKAGE CURRENT AND METHOD OF FORMING THE SAME

(71) Applicant: TAIWAN SEMICONDUCTOR MANUFACTURING COMPANY LTD., Hsinchu (TW)

(72) Inventors: Meng-Han Lin, Hsinchu (TW); Te-An Chen, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/826,255

(22) Filed: May 27, 2022

(65) Prior Publication Data
US 2022/0285524 A1    Sep. 8, 2022

Related U.S. Application Data

(62) Division of application No. 16/730,342, filed on Dec. 30, 2019, now Pat. No. 11,349,010.

(51) Int. Cl.
| | |
|---|---|
| H01L 29/66 | (2006.01) |
| H01L 21/02 | (2006.01) |
| H01L 21/225 | (2006.01) |
| H01L 21/265 | (2006.01) |
| H01L 21/285 | (2006.01) |
| H01L 21/311 | (2006.01) |
| H01L 21/324 | (2006.01) |
| H01L 21/762 | (2006.01) |
| H01L 21/768 | (2006.01) |
| H01L 21/8234 | (2006.01) |
| H01L 27/06 | (2006.01) |
| H01L 29/06 | (2006.01) |

(Continued)

(52) U.S. Cl.
CPC .. *H01L 29/66143* (2013.01); *H01L 21/02063* (2013.01); *H01L 21/2253* (2013.01); *H01L 21/26513* (2013.01); *H01L 21/28537* (2013.01); *H01L 21/31111* (2013.01); *H01L 21/324* (2013.01); *H01L 21/76224* (2013.01); *H01L 21/76805* (2013.01); *H01L 21/76895* (2013.01); *H01L 21/823437* (2013.01); *H01L 21/823462* (2013.01); *H01L 21/823475* (2013.01); *H01L 21/823481* (2013.01); *H01L 21/823493* (2013.01); *H01L 27/0629* (2013.01); *H01L 29/0649* (2013.01); *H01L 29/47* (2013.01); *H01L 29/872* (2013.01)

(58) Field of Classification Search
CPC . H01L 29/66143; H01L 29/872; H01L 29/47; H01L 27/0629
See application file for complete search history.

(56) References Cited

U.S. PATENT DOCUMENTS

| | | | | |
|---|---|---|---|---|
| 4,233,337 | A * | 11/1980 | Friedman | H01L 21/28537 257/519 |
| 6,825,073 | B1 * | 11/2004 | Wu | H01L 21/28537 438/575 |
| 2016/0308071 | A1 * | 10/2016 | Lin | H01L 21/76224 |

* cited by examiner

*Primary Examiner* — John A Bodnar
(74) *Attorney, Agent, or Firm* — WPAT LAW; Anthony King

(57) ABSTRACT

A semiconductor device includes a first well region in a substrate; a first dielectric layer over the first well region, wherein the first dielectric layer includes a stepped shape over the first well region; and a conductive layer over the first well region. The conductive layer forms a Schottky barrier interface with the first well region.

20 Claims, 20 Drawing Sheets

(51) Int. Cl.
*H01L 29/47* (2006.01)
*H01L 29/872* (2006.01)

SCHOTTKY BARRIER DIODE WITH REDUCED LEAKAGE CURRENT AND METHOD OF FORMING THE SAME

PRIORITY CLAIM AND CROSS-REFERENCE

The present application is a divisional application claiming the benefit of and priority to U.S. application Ser. No. 16/730,342, filed Dec. 30, 2019, the entire content of which is incorporated herein by reference.

BACKGROUND

Schottky barrier diodes, or simply Schottky diodes, are commonly used in modern semiconductor devices. The Schottky diode enjoys many advantages, such as a low forward voltage drop and a high switching speed, and thus plays an important role in radio frequency circuits, power devices, and other semiconductor devices. Further, an integrated semiconductor device is usually fabricated by incorporating Schottky diodes along with other semiconductor circuits. The performance of the integrated semiconductor device often relies heavily upon successful process integration of the Schottky diode with other circuits for reducing the processing costs while maintaining device performance. The electrical properties of the Schottky diode, such as switching speed and leakage current, may be somewhat compromised by the integrated processes.

While extensive research has been conducted in hopes of improving the techniques of process integration for manufacturing the Schottky diodes, such techniques still fail to meet requirements in many aspects. Therefore, there is a need to further improve the structures and manufacturing methods for existing Schottky diodes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
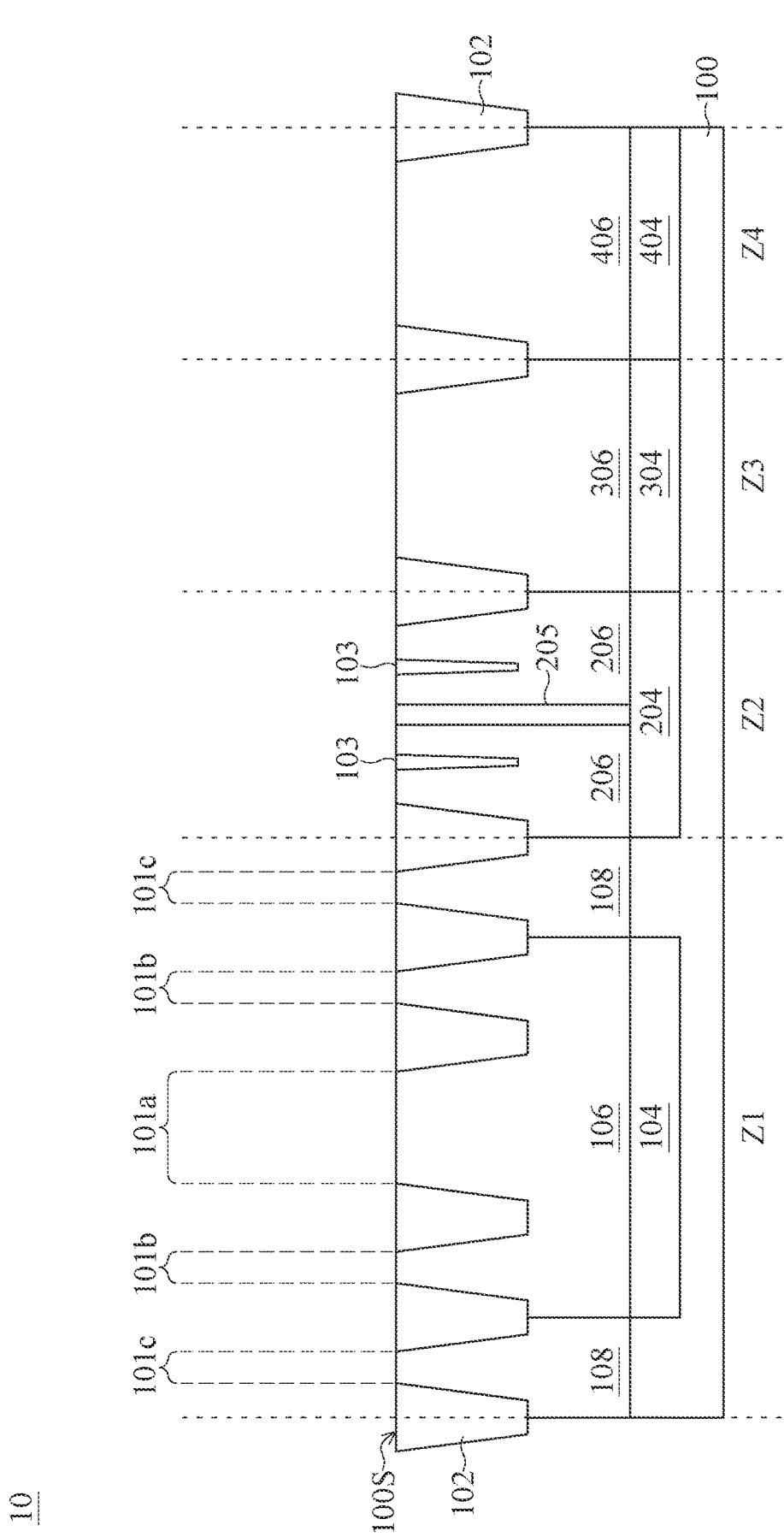
FIGS. 1 to 17 are cross-sectional views of intermediate stages of a method of manufacturing a Schottky barrier diode, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" and "substantially" generally mean within 10%, 5%, 1% or 0.5% of a given value or range. Alternatively, the terms "about," "substantial" and "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Leakage current is one of the factors used to measure the performance of a Schottky barrier diode (SBD) in which the current level under a reversed bias should be kept as low as possible for reducing power loss. However, the measured leakage current of a manufactured SBD may be greater than the specification due to poor process control. One possible cause of the leakage current's failure to meet the specification is an insufficient Schottky barrier height formed at the interface between the metal region and the semiconductor region in the anode of the SBD. The Schottky barrier height may become lower than expected due to defective contact between the metal region and the semiconductor region. For example, some process materials with a work function lower than that of the metal region may contaminate the interface between the metal region and the semiconductor region. In view of the above, it is critical to ensure complete removal of undesired materials of the SBD during the manufacturing process.

The present disclosure provides an SBD with a low leakage current and a method of manufacturing the low-leakage SBD. The proposed scheme discusses shared processes that can improve the SBD as well as other circuits, such as the forming of metal-oxide semiconductor (MOS) transistors on a substrate. For example, one or more oxide layers that are formed as gate oxide layers for different types of MOS transistors can also be used to form the SBD. The oxide layers may not be functional in a finalized SBD, yet are left in the structure of the SBD temporarily in order to aid in removing one or more undesired layers left after the formation of the MOS transistors. Thus, the sharing of the oxide layer by the MOS transistors and the SBD eliminates the step of forming a separate oxide layer for the SBD. After the undesired layers in the SBD have been removed, the oxide layer should then also be at least partially removed from the structure of the SBD. However, as technology evolves toward more advanced generations, the specification of the oxide layer changes and thus the oxide layer in the SBD structure may not be completely removed. The residual oxide layer left in the SBD structure may degrade the SBD performance.

The proposed oxide layer removal scheme provides benefits of better removal capability without using extra masks. In some cases, existing masks used for cleaning of other features are leveraged to simultaneously remove all or part of the oxide layer in the SBD. Therefore, the performance of the SBD can be maintained such that the forward current and leakage current attain the specified levels. Meanwhile, due to the efficiency of the process integration, the manufacturing cost and cycle time are not increased. Embodiments of the method of manufacturing the SBD are described below in detail.

Figure 15:
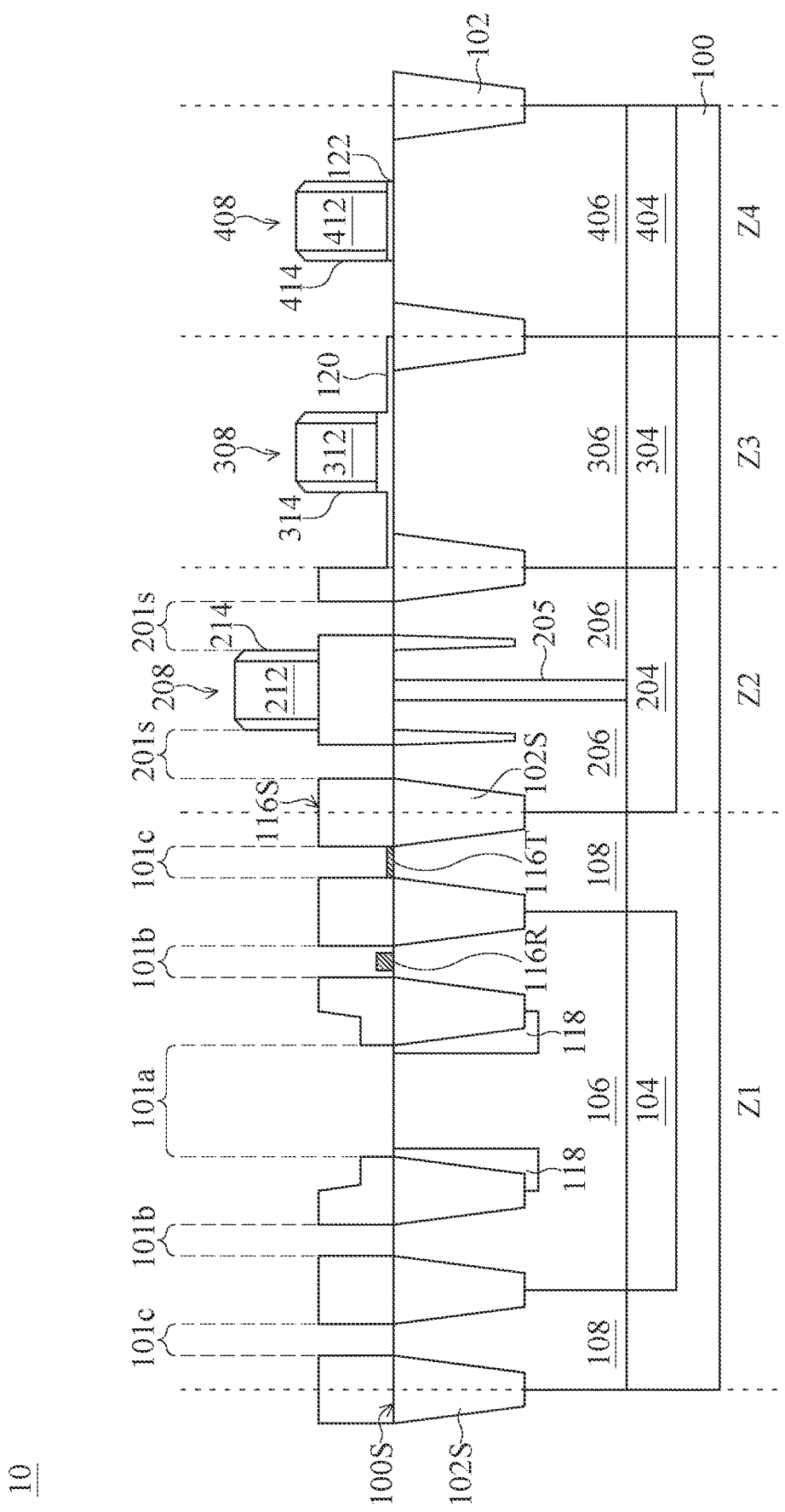
Figure 16:
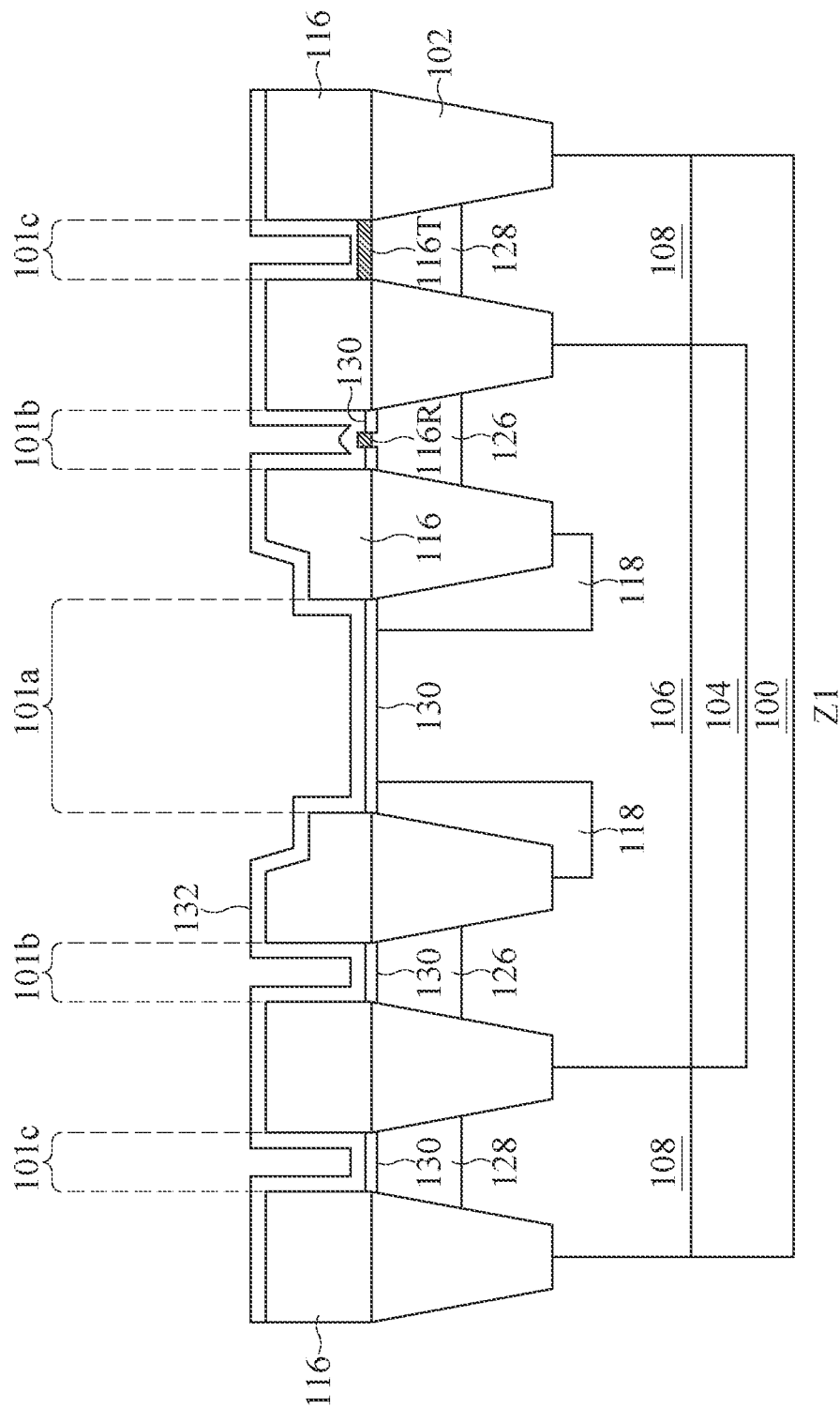
Figure 17:
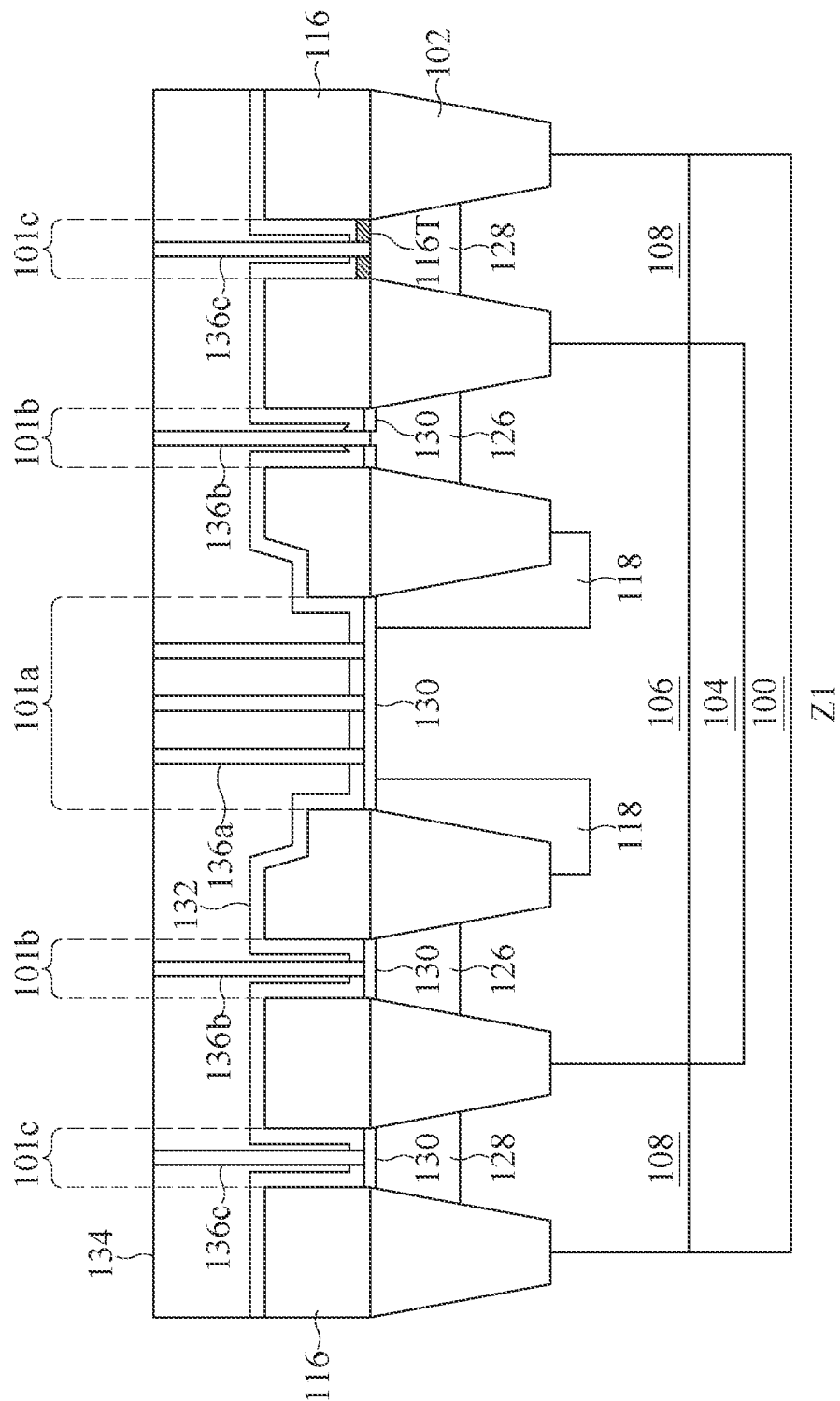

FIGS. 1 to 8, 9A, and 10 to 14 are cross-sectional views of intermediate stages of a method of manufacturing the Schottky diode 10, in accordance with some embodiments. FIGS. 9B and 9C are cross-sectional views of intermediate stages of alternative methods of manufacturing the Schottky diode 10, in accordance with some embodiments that include operations illustrated by FIG. 9B or 9C, rather than FIG. 9A. FIGS. 15 to 17 are cross-sectional views of intermediate stages of another method of manufacturing the Schottky diode 10 that follow the operations illustrated by FIG. 1 to 8, 9B or 9C, 10, and 11, in accordance with some embodiments. It should be understood that additional operations can be provided before, during, and after processes shown in FIGS. 1 to 17, and some of the operations described below can be replaced or eliminated for additional embodiments of the method. The order of the operations and processes may be interchangeable. Further, the configuration, structure, materials, operations or processes employed in one embodiment may be identical to or similar to those employed in other embodiments, and the detailed explanation thereof may be omitted.

Referring to FIG. 1, a substrate 100 is formed or provided. The substrate 100 may be a semiconductor substrate, such as a bulk semiconductor, a semiconductor-on-insulator (SOI) substrate, or the like. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate layer that is typically formed of silicon or glass. Other substrates, such as a multi-layered or gradient substrate, may also be used. The substrate 100 may be doped (e.g., with a p-type or an n-type dopant) or undoped. In some embodiments, the semiconductor material of the substrate 100 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 100 may be partitioned into different device zones in which various types of semiconductor devices are formed. For example, a first device zone Z1, a second device zone Z2, a third device zone Z3 and a fourth device zone Z4 may be referred to as an SBD zone, a high-voltage (HV) zone, an input/output (I/O) zone and a core zone, respectively. In the first device zone Z1, one or more SBD devices are manufactured. In addition, MOS transistors operating at a high voltage (e.g., 12 volts or above), a medium voltage (e.g., between about 5 volts and 6 volts), and a low voltage (e.g., about 3 volts or below) are formed in the device zones Z2, Z3 and Z4, respectively. The device zones Z1 to Z4 may be processed using shared or separate processes as described in subsequent paragraphs. The device zones Z1 to Z4 may or may not be immediately adjacent to one another in the substrate 100. FIG. 1 is provided for illustrative purposes only, and other numbers or configurations of the device zones are also within the contemplated scope of the present disclosure.

The substrate 100 includes a first well region 106 of a first conductivity type in the first device zone Z1. In some embodiments, the first conductivity type is n-type and the first well region 106 is an n-well (NW). In some embodiments, the dopant concentration of the first well region 106 is between about 10E11 ions/cm$^3$ and about 10E14 ions/cm$^3$. In some embodiments, the first well region 106 is formed by an implantation operation. The implanted impurities of the first conductivity type may be selected from phosphorus, arsenic, antimony, bismuth, selenium, tellurium, and other suitable n-type dopants. In some embodiments, the first well region 106 is formed by epitaxially growing a semiconductor layer on the substrate 100, and then performing an n-type impurity implantation.

In some embodiments, the first device zone Z1 further includes a second well region 104, referred to as a deep well region, of the first conductivity type beneath the first well region 106. In some embodiments, the second well region 104 is a deep n-well (DNW). In some embodiments, the second well region 104 has a width substantially equal to or less than that of the first well region 106 from a cross-sectional view, while in other embodiments the second well region 104 is omitted. In some embodiments, the second well region 104 is formed by implanting n-type impurities into the substrate 100. The implanted impurities of the first conductivity type may be selected from phosphorus, arsenic, antimony, bismuth, selenium, tellurium, and other suitable n-type dopants. In some embodiments, the second well region 104 is formed by epitaxially growing a semiconductor layer on the substrate 100, and then performing an n-type impurity implantation.

In some embodiments, the first device zone Z1 further includes a third well region 108 of a second conductivity type opposite to the first conductivity type in the substrate 100. The third well region 108 is formed adjacent to or surrounding the first well region 106. In some embodiments, the second conductivity type is p-type and the third well region 108 is a p-well (PW). In some embodiments, the dopant concentration of the third well region 108 is between about 10E11 ions/cm$^3$ and about 10E14 ions/cm$^3$. In some embodiments, the third well region 108 is formed by implanting p-type impurities into the substrate 100. The p-type impurities may be selected from boron, boron difluoride and other suitable p-type dopants. In some embodiments, the third well region 108 may be formed by epitaxially growing a semiconductor layer on the substrate 100, and then performing a p-type impurity implantation.

The second device zone Z2 may include a first well region 206. In some embodiments, the first well region 206 is an n-well for a p-channel MOS (PMOS) transistor, or a p-well for an n-channel MOS (NMOS) transistor. In some embodiments, the dopant concentration of the first well region 206 is between about 10E11 ions/cm$^3$ and about 10E14 ions/cm$^3$. In some embodiments, the first well region 206 is formed by an implantation operation. The implanted impurities of the first conductivity type may be selected from phosphorus, arsenic, antimony, bismuth, selenium, tellurium, and other suitable n-type dopants, while the implanted impurities of the second conductivity type may be selected from boron, boron difluoride and other suitable p-type dopants. Similarly, the third device zone Z3 may include a first well region 306, and the fourth device zone Z4 may include a first well region 406. In some embodiments, the first well region 306 or 406 is an n-well for a PMOS transistor, or a p-well for an NMOS transistor. The materials, configurations and forming methods of the first well regions 206, 306 and 406 in the respective device zones Z2 to Z4 may be similar to those of the first well region 106 in the first device zone Z1, and detailed descriptions are not repeated herein.

In some embodiments, each of the device zones Z2 to Z4 includes a second well region 204, 304 and 404, referred to as a deep well region, beneath the respective first well region 206, 306 and 406. In some embodiments, the second well region 204, 304 or 404 comprises a same conductivity type as the corresponding first well region 206, 306 or 406, and may be a deep n-well or a deep p-well. In some embodiments, the second well region 204, 304 and 404 may be omitted from the respective second device zones. In some embodiments, the materials, configurations and forming methods of the second well regions 204, 304 and 404 in the respective device zones Z2 to Z4 may be similar to those of the second well region 104 in the first device zone Z1, and detailed descriptions are not repeated herein.

In some embodiments, the device zone Z2 further includes a third well region 205 in the first well region 206. The first well region 206 and the third well region 205 have opposite conductivity types. In some embodiments, the first well region 206 is an HV p-well and the third well region 205 is an HV n-well. The third well region 205 extends from an upper surface 100S of the substrate 100 to the second well region 204 of the device zone Z2. In some embodiments, the third well region 205 runs through the first well region 206. In some embodiments, the third well region 205 divides the first well region 206 into two parts. In some embodiments, the third well region 205 is formed by implanting n-type or p-type impurities into the substrate 100. The implanted impurities of the first conductivity type may be selected from phosphorus, arsenic, antimony, bismuth, selenium, tellurium, and other suitable n-type dopants, while the implanted impurities of the second conductivity type may be selected from boron, boron difluoride and other suitable p-type dopants.

In some embodiments, the substrate 100 further includes isolation regions 102 defining the device zones Z1 to Z4. The isolation regions 102 may laterally surround the device zones Z1 to Z4. In some embodiments, the isolation region 102 is referred to as a shallow trench isolation (STI). The isolation region 102 may be formed of a dielectric material, such as silicon oxide, silicon nitride, silicon oxynitride, a low-k dielectric material, or a combination thereof. In some embodiments, the isolation region 102 is formed by etching trenches on the top surface of the substrate 100 and filling dielectric materials into these trenches by thermal oxidation, thermal nitridation, physical vapor deposition (PVD), chemical vapor deposition (CVD), atomic layer deposition (ALD), a combination thereof, or the like.

The isolation regions 102 may be formed in the first device zone Z1 to delimit the well regions of respective device zones. For example, the isolation regions 102 are formed to define the first well region 106 and the third well region 108 of the first device zone Z1. The isolation regions 102 formed in the first device zone Z1, which is an SBD zone in the depicted embodiment, are further configured to define an anode area 101a, cathode areas 101b adjacent to the anode area 101a, and bulk areas 101c on two sides of the cathode areas 101b opposite to the anode area 101a. The anode area 101a, the cathode areas 101b and the bulk areas 101c are separated from each other by the isolation region 102 in their upper portions close to the upper surface 100S of the substrate 100, and coupled to one another through their lower portions. In the embodiment depicted in FIG. 1, the anode area 101a is formed between two cathode areas 101b from a cross-sectional view. In some embodiments, however, in a plan view, the cathode area 101b has a ring shape surrounding the anode area 101a. In alternative embodiments, the cathode areas 101b are constituted by two strips on opposite sides of the anode area 101a in a plan view. In some embodiments, in a plan view, the bulk area 101c forms a ring shape surrounding the anode area 101a and the cathode area 101b, or the bulk area 101c is constituted by two separate strips on outer sides of the opposite cathode areas 101b.

In some embodiments, isolation regions 103 are formed in the second device zone Z2 and exposed from the surface 100S. In some embodiments, the isolation region 103 is formed in the first well region 206 between the isolation region 102 and the second well region 205. The isolation regions 103 may include the same depths as those of the isolation regions 102. In some embodiments, the isolation region 103 has a width less than a width of the isolation region 102. In some embodiments, the isolation regions 103 are formed in source/drain regions of an HV transistor in the second device zone Z2 for enhancing the transistor performance under high operating voltages. The materials and method of the forming of the isolation regions 103 are similar to those of the forming of the isolation regions 102.

In some embodiments, the isolation regions 102 and 103 are initially formed, followed by the implantation of the deep well regions 104/204/304/404, the first well regions 106/206/306/406, and the third well regions 108/205 in sequence. However, the formation order of the isolation regions 102 and 103, the deep well regions 104/204/304/404, the first well regions 106/206/306/406 and the third well regions 108/205 may be appropriately changed and is not limited to the embodiments depicted in the present disclosure.

Figure 2:
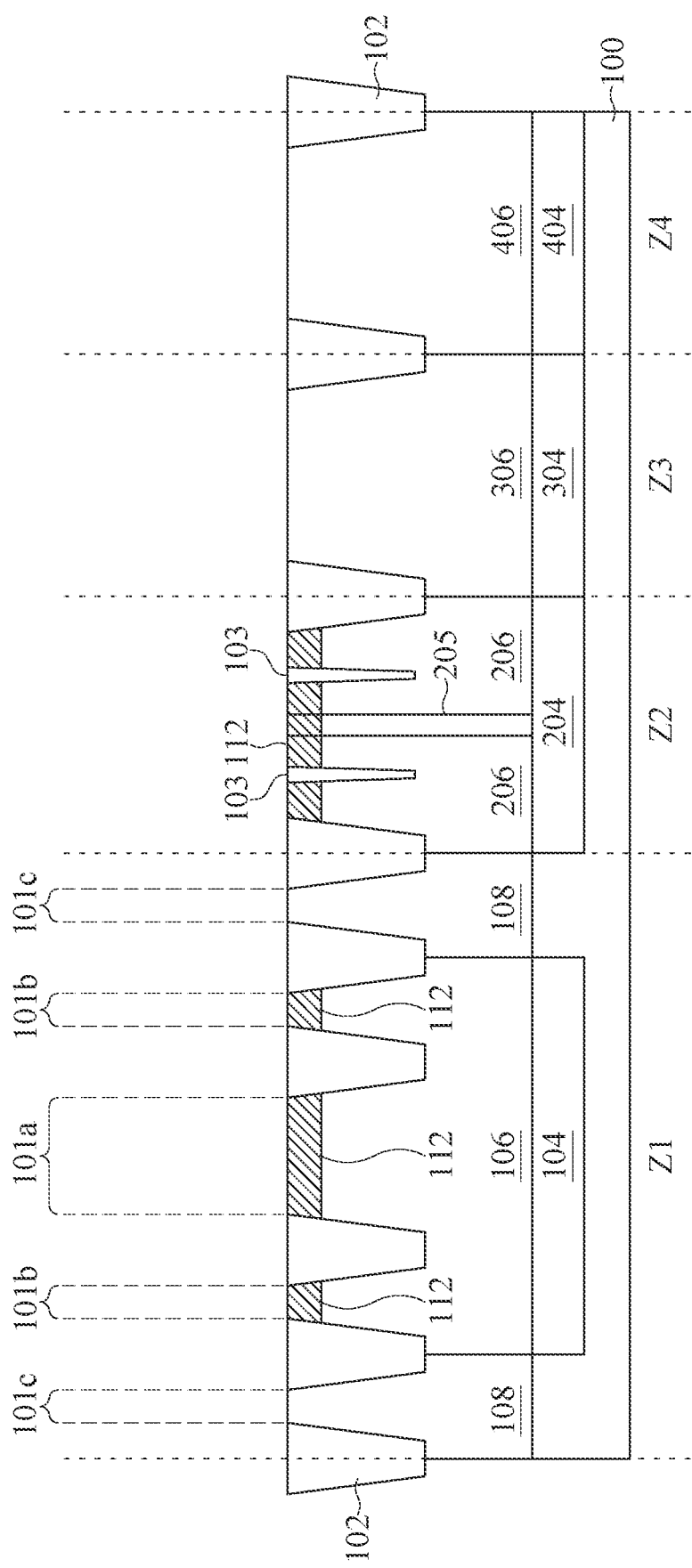

Referring to FIG. 2, a surface-doped layer 112 is formed in the first well region 106. The surface-doped layer 112 is formed in the anode area 101a of the first well region 106. In some embodiments, the surface-doped layer 112 is further formed in the cathode area 101b of the first well region 106. In some embodiments, the surface-doped layer 112 is not formed in the bulk area 101c. In some embodiments, the surface-doped layer 112 is not formed in the third or fourth device zone Z3 or Z4. In some embodiments, the surface-doped layer 112 includes a p-type dopant, such as boron, boron difluoride or another suitable p-type dopant. In some embodiments, the surface-doped layer 112 is also formed in the first well region 206 and the second well region 205 for forming PMOS transistors in the second device zone Z2.

The p-type dopants of the surface-doped layer 112, used to tune the threshold voltage (Vt) of a PMOS transistor, are implanted into the n-type channel region of the PMOS transistor. In some embodiments, the surface-doped layer 112 is formed in the n-type first well region 106 of the first device zone Z1 at the time when the surface-doped layer 112 is formed in the PMOS or NMOS transistors in the second device zone Z2. In some embodiments, the surface-doped layer 112 formed in the first well region 106 reduces forward current performance of an SBD in the first device zone Z1. Introduction of an extra mask to block the formation of the surface-doped layer 112 in the first device zone Z1 may help resolve the issue but also causes additional processing time and cost.

Figure 3:
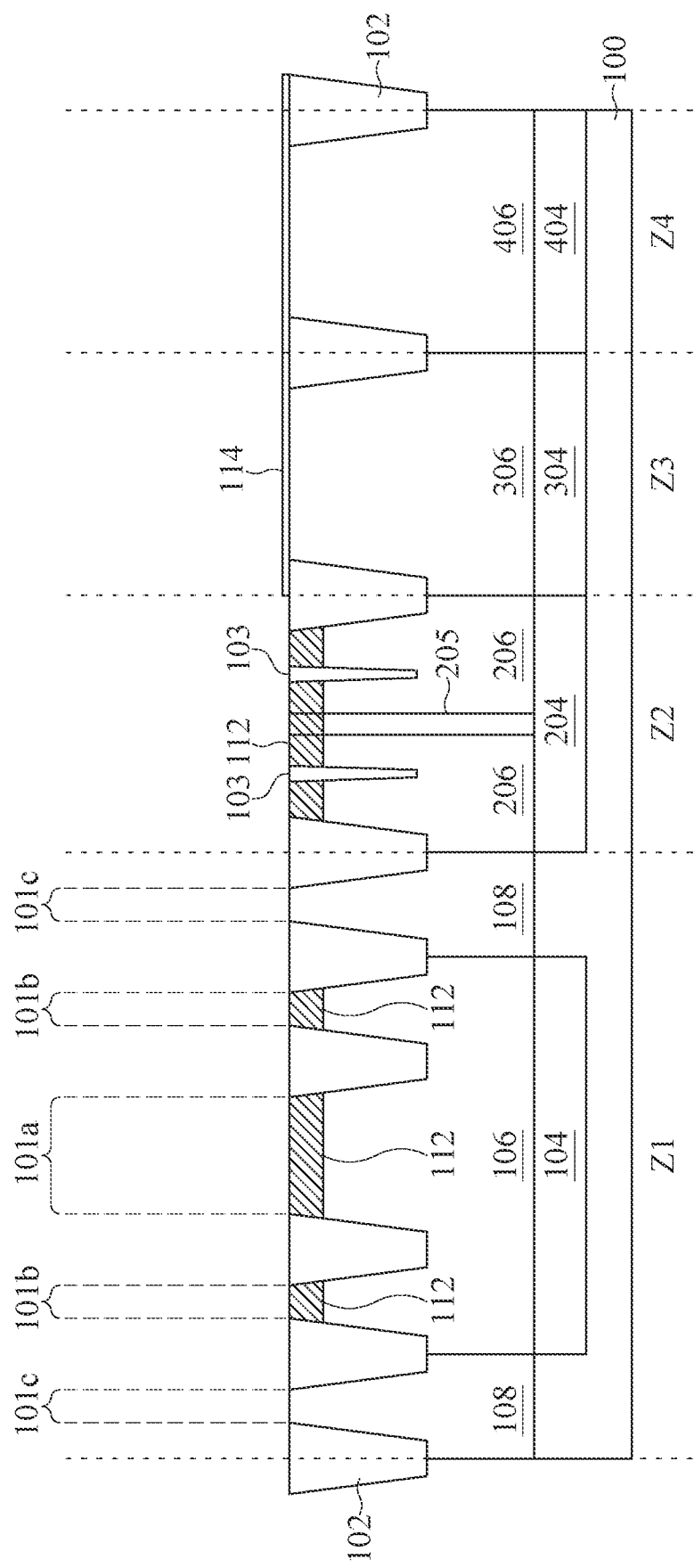

Referring to FIG. 3, a dielectric layer 114 is formed over the substrate 100 and the surface-doped layer 112 after the forming of the surface-doped layer 112. The dielectric layer 114 is further patterned so that portions of the dielectric layer 114 in the first and second device zones Z1 and Z2 are removed. In some embodiments, the dielectric layer 114 includes nitride, such as silicon nitride. In some embodiments, the dielectric layer 114 is used as an etch stop layer and is subsequently removed in follow-up processing steps. The dielectric layer 114 may be formed using PVD, CVD, ALD, thermal nitridation, or other suitable deposition methods.

Figure 4:
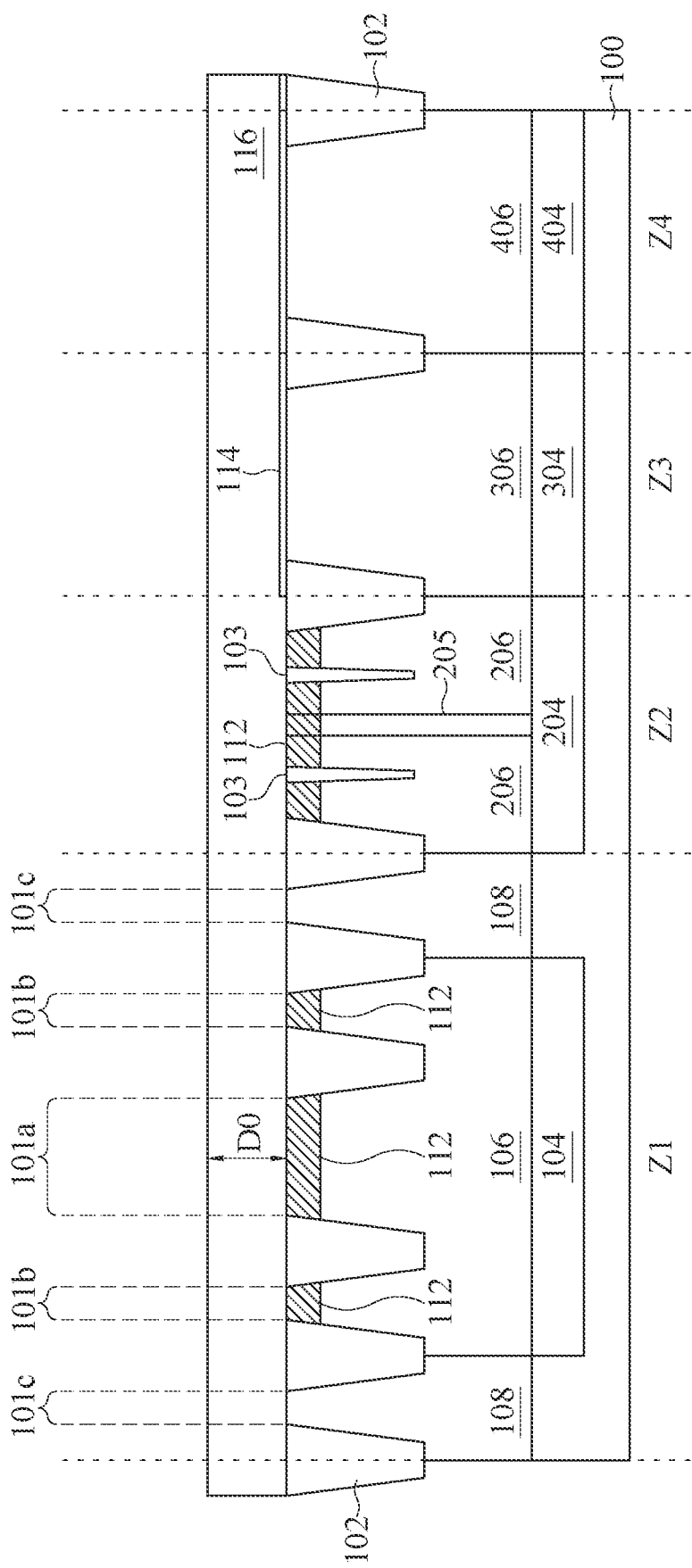
Figure 11:
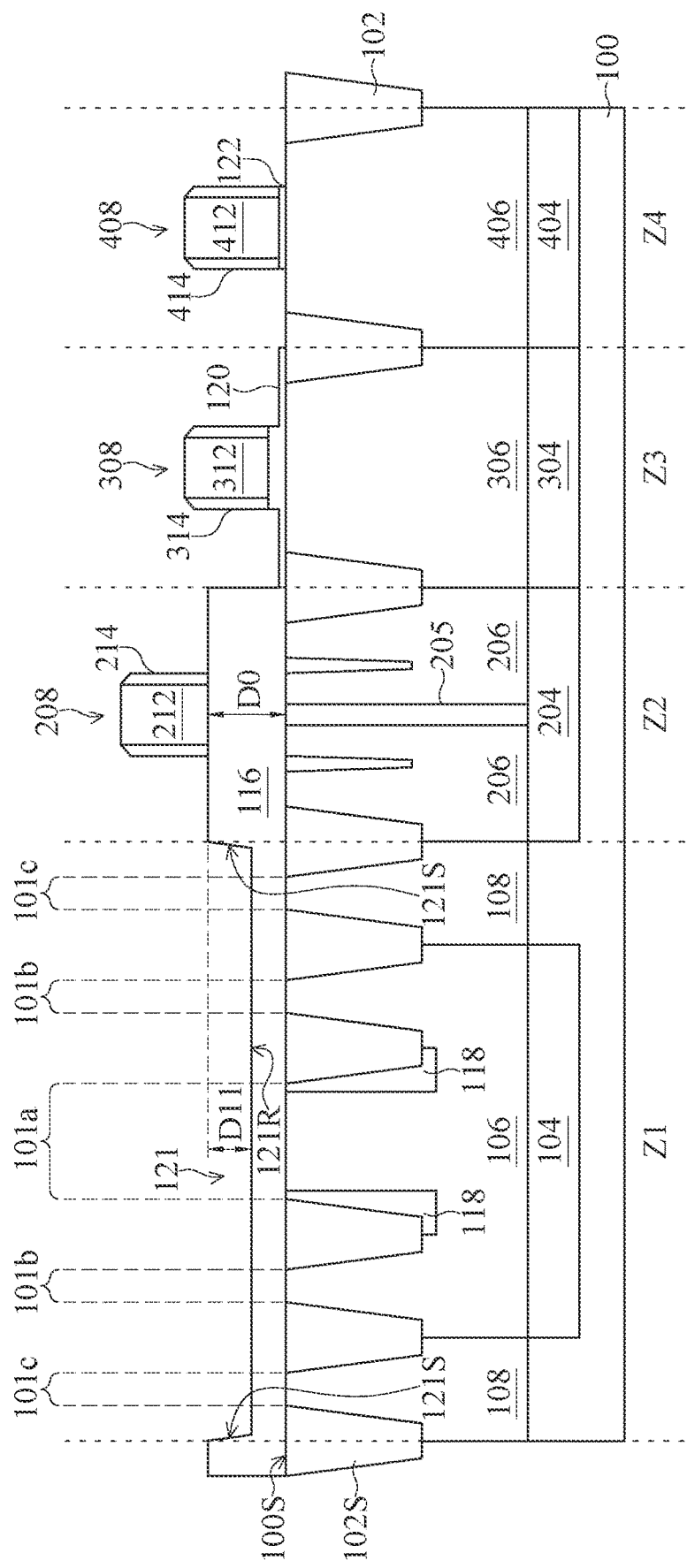

FIG. 4 illustrates the formation of a dielectric layer 116 over the substrate 100. The dielectric layer 116 is formed over the substrate 100 across the device zones Z1 to Z4. The dielectric layers 114 and 116 may be formed of different materials. In some embodiments, the dielectric layer 116 includes silicon oxide. In some embodiments, the dielectric layer 116 serves as a gate dielectric layer of a PMOS or an NMOS transistor (not separately shown; a gate structure 208 for such transistor is shown in FIG. 11) in the second device zone Z2. In some embodiments, the dielectric layer 116 is formed on the substrate 100 without using a mask, so the dielectric layer 116 extends in the first, third and fourth device zones Z1, Z3 and Z4 as well. In some embodiments, the dielectric layer 116 covers the entire first well region 106 and the entire third well region 108. In some embodiments, the dielectric layer 116 is formed using PVD, CVD, plasma-enhanced CVD (PECVD), low-pressure CVD (LPCVD) or atmospheric-pressure CVD (APCVD), ALD, spin-on coating, thermally grown process, or any suitable formation process. In some embodiments, the dielectric layer 116 is formed using thermal oxidation. In some embodiments, the dielectric layer 116 has a thickness D0 suitable for an HV transistor operating at a high voltage, and the thickness D0 of the dielectric layer 116 may be in a range between about 800 Å and about 2000 Å. In some embodiments, the thickness D0 of the dielectric layer 116 is in a range between about 900 Å and about 1500 Å, or between about 950 Å and about 1200 Å.

Figure 5:
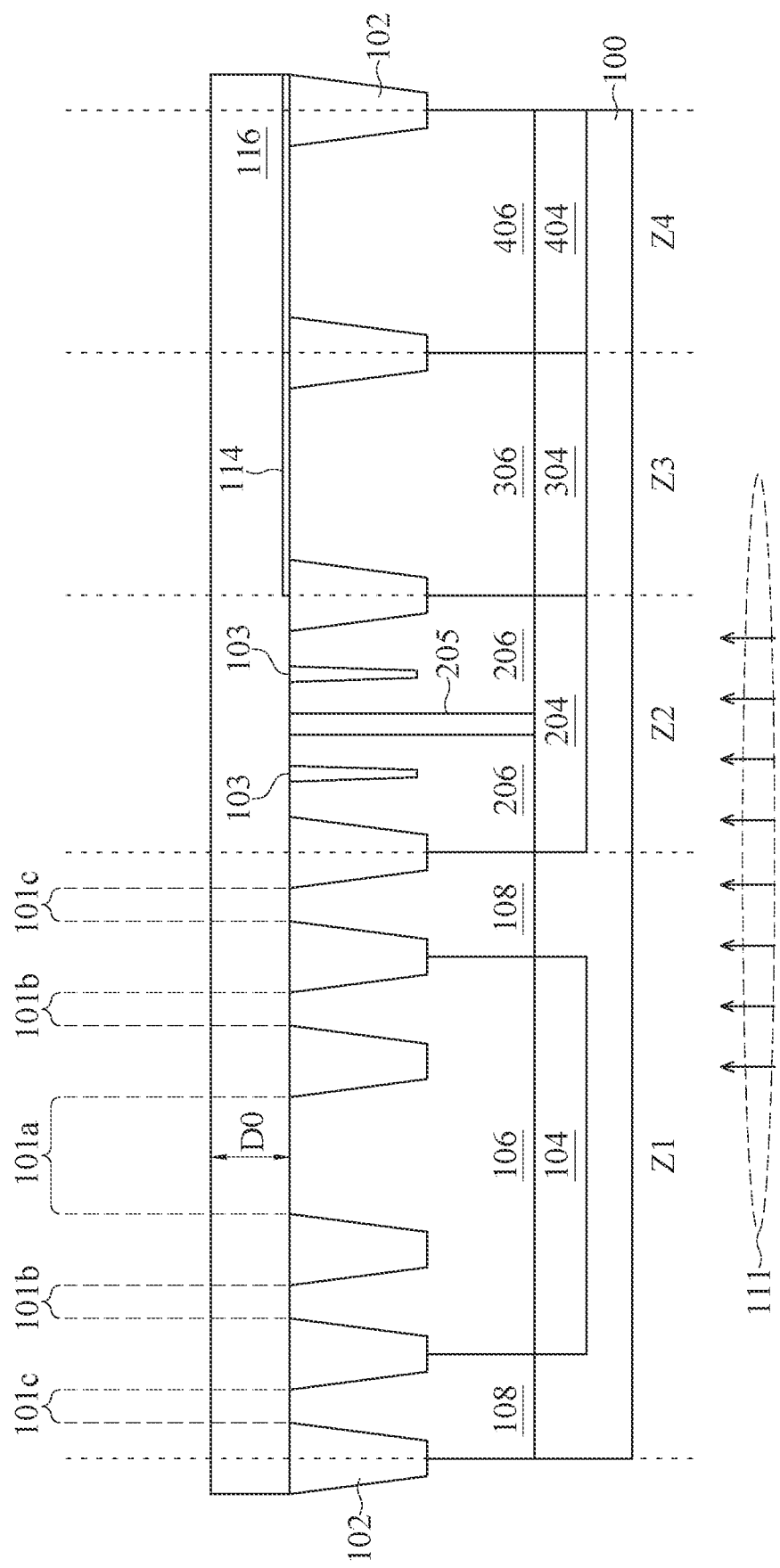

Referring to FIG. 5, in some embodiments, a thermal treatment 111 is performed on the substrate 100 to drive dopants of the surface-doped layer 112 into the dielectric layer 116. As discussed previously, the dopants of the surface-doped layer 112 having an opposite dopant type (e.g., the second conductivity) in the first well region 106 may reduce the performance of the SBD device. As such, the oxide-containing dielectric layer 116 serves as an absorption layer of the surface-doped layer 112 in which dopants in the surface-doped layer 112 are driven to diffuse into the dielectric layer 116 with the help of the thermal treatment 111. Consequently, the dopants of the surface-doped layer 112 are partially or completely driven away from the well regions 106, 205 and 206. On the other hand, the nitride-containing dielectric layer 114 cannot serve as an absorption layer since it is difficult to cause p-type dopants to diffuse into a nitride material. In some embodiments, the thermal treatment 111 is performed at a temperature greater than or equal to 400° C. In some embodiments, the thermal treatment 111 is performed at a temperature lower than or equal to 1200° C., although a higher temperature is also applicable. Since the dopants in the surface-doped layer 112 are absorbed by the dielectric layer 116, the SBD device formed in the first device zone Z1 has a lowered turn-on voltage and thus the performance of the SBD device is improved. In some embodiments, the doping concentration arrangement of the well regions in the second device zone Z2, as shown in FIG. 1, are determined by taking into account the effect of the thermal treatment 111, and thus the performance of the transistors in the second device zone Z2 is not substantially affected by the thermal treatment 111.

In some embodiments in which the dielectric layer 116 is formed using thermal oxidation, the thermal treatment 111 accompanies the thermal oxidation and can help drive the dopants of the surface-doped layer 112 into the dielectric layer 116. Additional cost and time of a standalone thermal treatment can thus be eliminated. In other words, the thermal treatment 111 can be performed on the surface-doped layer 112 during the formation of the dielectric layer 116. Alternatively, in some embodiments, the thermal treatment 111 can be performed independently alone during subsequent operations.

Figure 6:
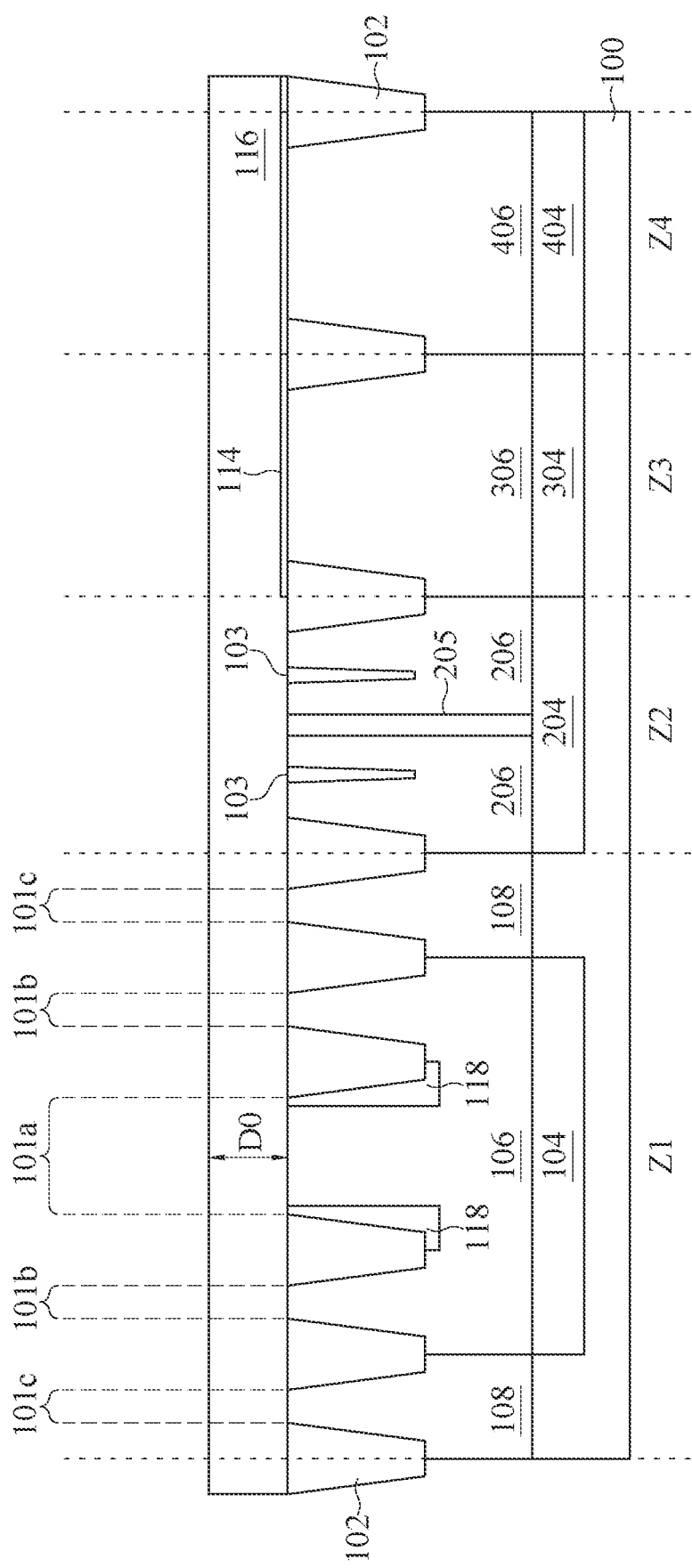

Referring to FIG. 6, a fourth well region 118 is formed in the first well region 106. The fourth well region 118 includes dopants having a conductivity type, such as p-type, opposite to that of dopants in the first well region 106. In some embodiments, the fourth well region 118 serves as a protection layer for improving breakdown voltage of the SBD device and may include a ring shape from a plan view, wherein the ring surrounds the anode area 101a of the first well region 106. In some embodiments, the fourth well region 118 surrounds a silicide layer (not shown in FIG. 6; illustrated in FIG. 13) over the anode area 101a in a plan view. In some embodiments, the dopant concentration of the fourth well region 118 is between about 10E11 ions/cm³ and about 10E14 ions/cm³. The fourth well region 118 may be formed using an implantation operation, followed by an annealing process, such as a rapid thermal annealing process (RTA). In some embodiments, the annealing process for forming the fourth well region 118 is performed at a temperature greater than or equal to 400° C. In some embodiments, the temperature of the thermal treatment is less than or equal to 1200° C., although a higher temperature is also applicable.

During the formation of the fourth well region 118, the accompanying annealing process may aid in driving residual dopants of the surface-doped layer 112 into the dielectric layer 116. The annealing processes used in forming the dielectric layer 116 and the fourth well region 118 function jointly to remove the surface-doped layer 112 from the first well region 106 without extra thermal processes.

Figure 7:
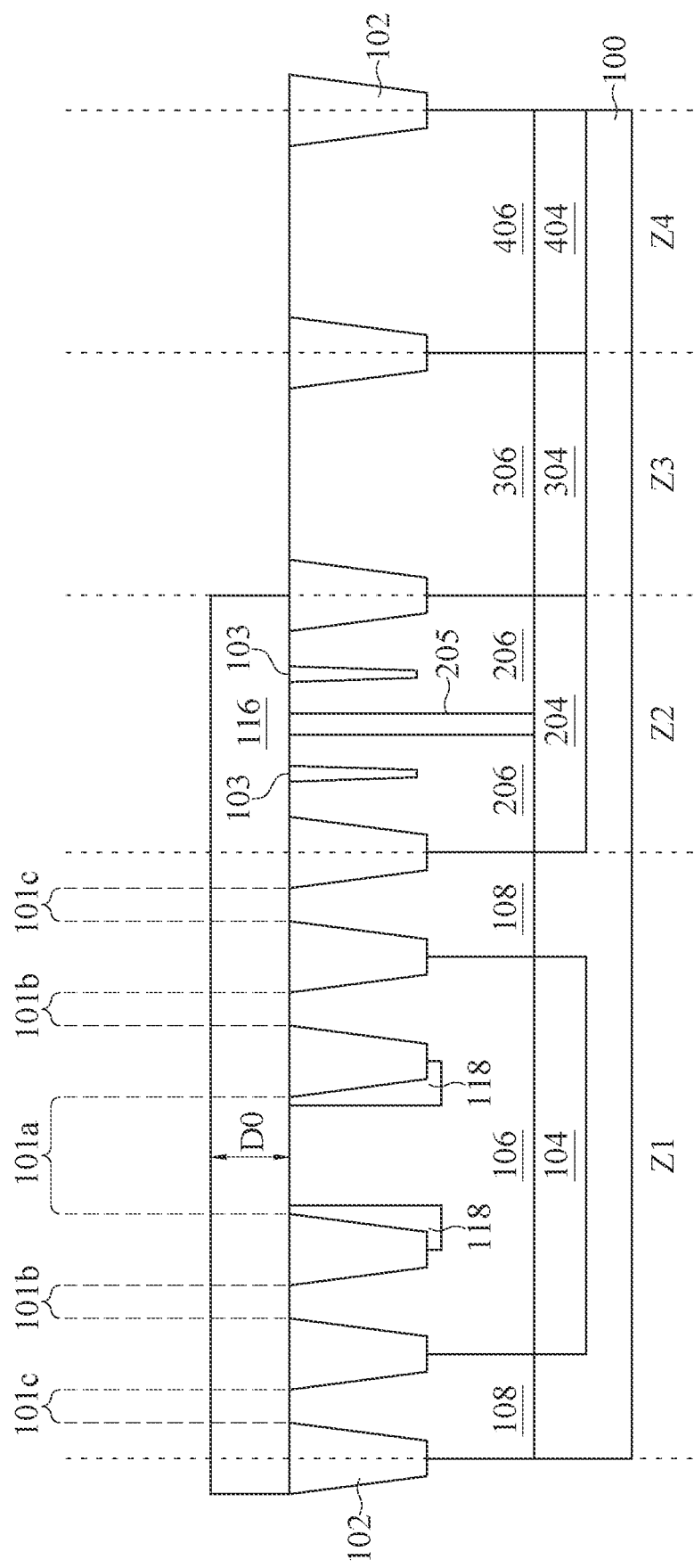

Referring to FIG. 7, the dielectric layer 116 is patterned, such that the portions of the dielectric layer 116 covering the third and fourth device zones Z3 and Z4 are removed. The dielectric layer 116 over the first and second device zones Z1 and Z2 remain over the substrate 100. In some embodiments, a patterned mask layer is formed over the dielectric layer 116 such that the dielectric layer 116 is patterned according to the patterned mask layer. The removal of the dielectric layer 116 may be performed using a dry etch, a wet etch, or a combination thereof, such as a reactive ion etch (RIE). Further, the dielectric layer 114 may serve as an etching mask during the etching operation. The patterned mask layer may be stripped after the patterning for the dielectric layer 116 is completed.

Next, the dielectric layer 114 is removed from the third device zone Z3 and the fourth device zone Z4. The removal of the dielectric layer 114 may be performed using a dry etch, a wet etch, or an RIE.

Figure 8:
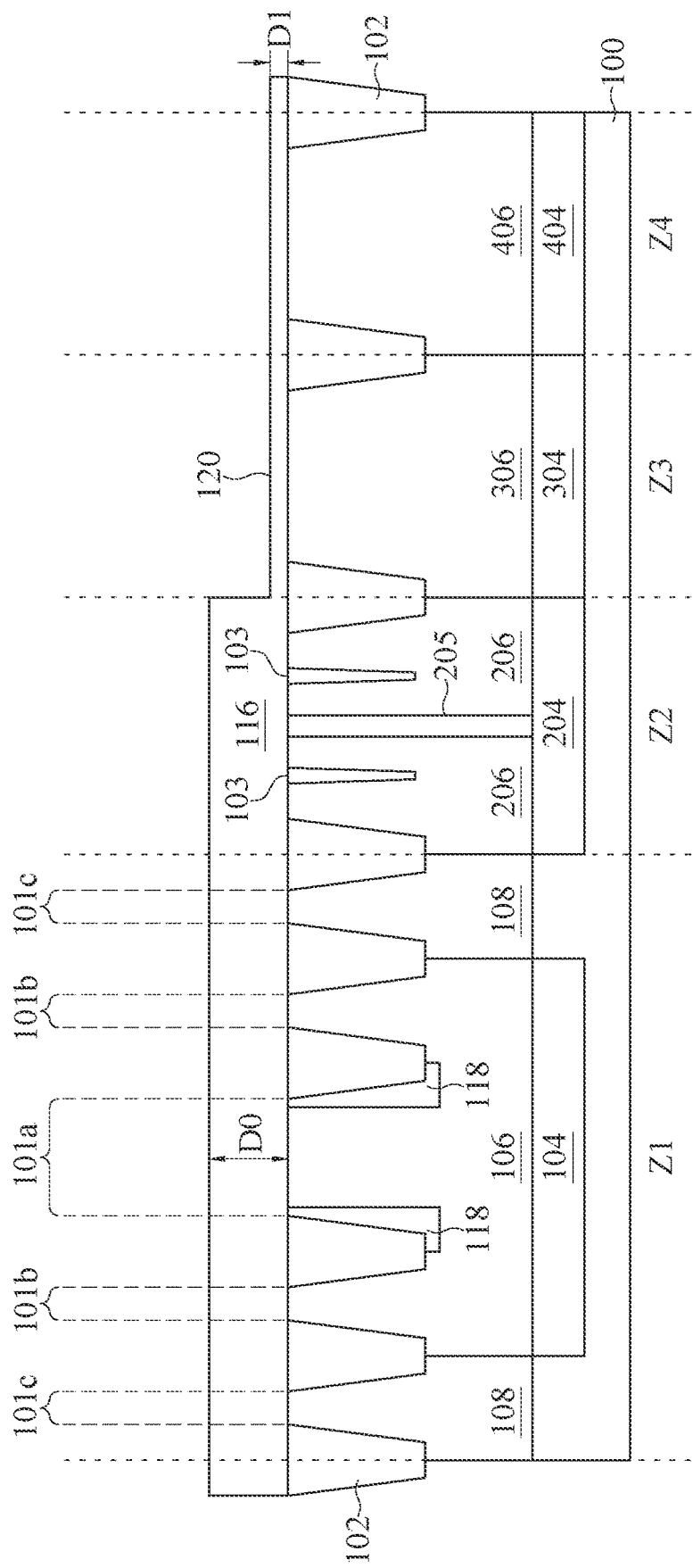

Subsequently, another dielectric layer 120 is formed over the substrate 100 in the third device zone Z3, as illustrated in FIG. 8. The dielectric layer 120 acts as a gate dielectric layer of a PMOS or an NMOS transistor (not separately shown; a gate structure 308 for such transistor is shown in FIG. 11) in the third device zone Z3. In some embodiments, the dielectric layer 120 is formed on the substrate 100 without using a mask, so the dielectric layer 120 extends over the first device zone Z1, the second device zone Z2 and the fourth device zone Z4. In some embodiments, the dielectric layer 120 entirely covers the entire first well regions 306 and 406 in the third and fourth device zones Z3 and Z4. In some embodiments, the dielectric layer 120 is formed using PVD, CVD, PECVD, LPCVD, APCVD, ALD, spin-on coating, thermally grown process, or any suitable formation process. In some embodiments, the dielectric layer 120 includes silicon oxide. In some embodiments, the dielectric layer 120 is formed of the same material as the dielectric layer 116. In some embodiments, the dielectric layer 120 has a thickness D1 suitable for an I/O transistor operating at a medium voltage, and may be in a range between about 50 Å and about 300 Å, or in a range between about 100 Å and about 180 Å, or in a range between about 110 Å and about 130 Å, although greater or smaller thicknesses are also applicable. In some embodiments, the thickness D1 of the dielectric layer 120 is less than that of the dielectric layer 116. In some embodiments, a thickness ratio of D0/D1 is between about 6.0 and about 12.0, or between about 8.0 and about 10.0. Further, given that the materials of the dielectric layers 116 and 120 are the same, the growth rate of the dielectric layer 120 over the dielectric layer 116 in the first and second device zones Z1 and Z2 is less than the thickness D1 in the third and fourth device zones Z3 and Z4. Therefore, the added thickness of the dielectric layer 120 over the dielectric layer 116 in the first and second device zones Z1 and Z2 may be less than the thickness D1 of the dielectric layer 120 in the third and fourth device zones Z3 and Z4.

Figure 9A:
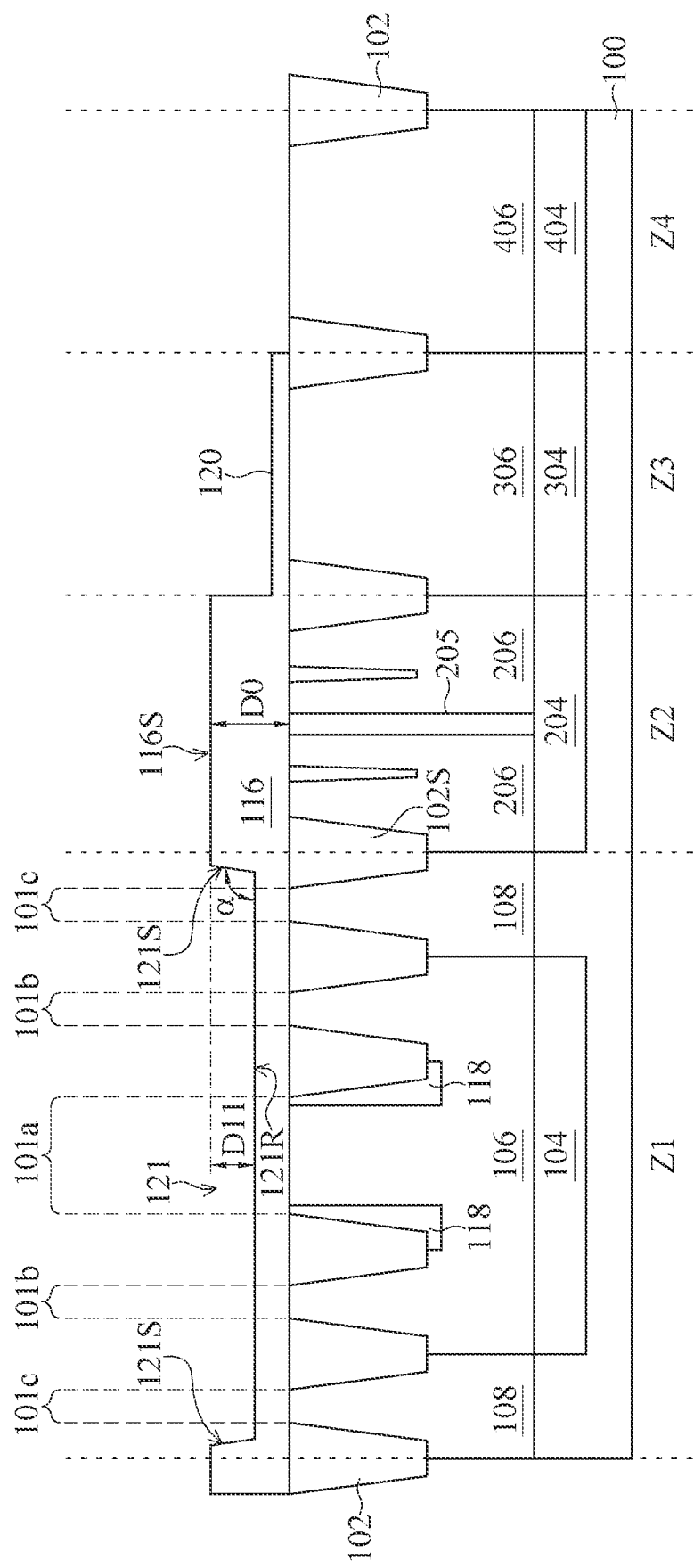
Figure 9B:
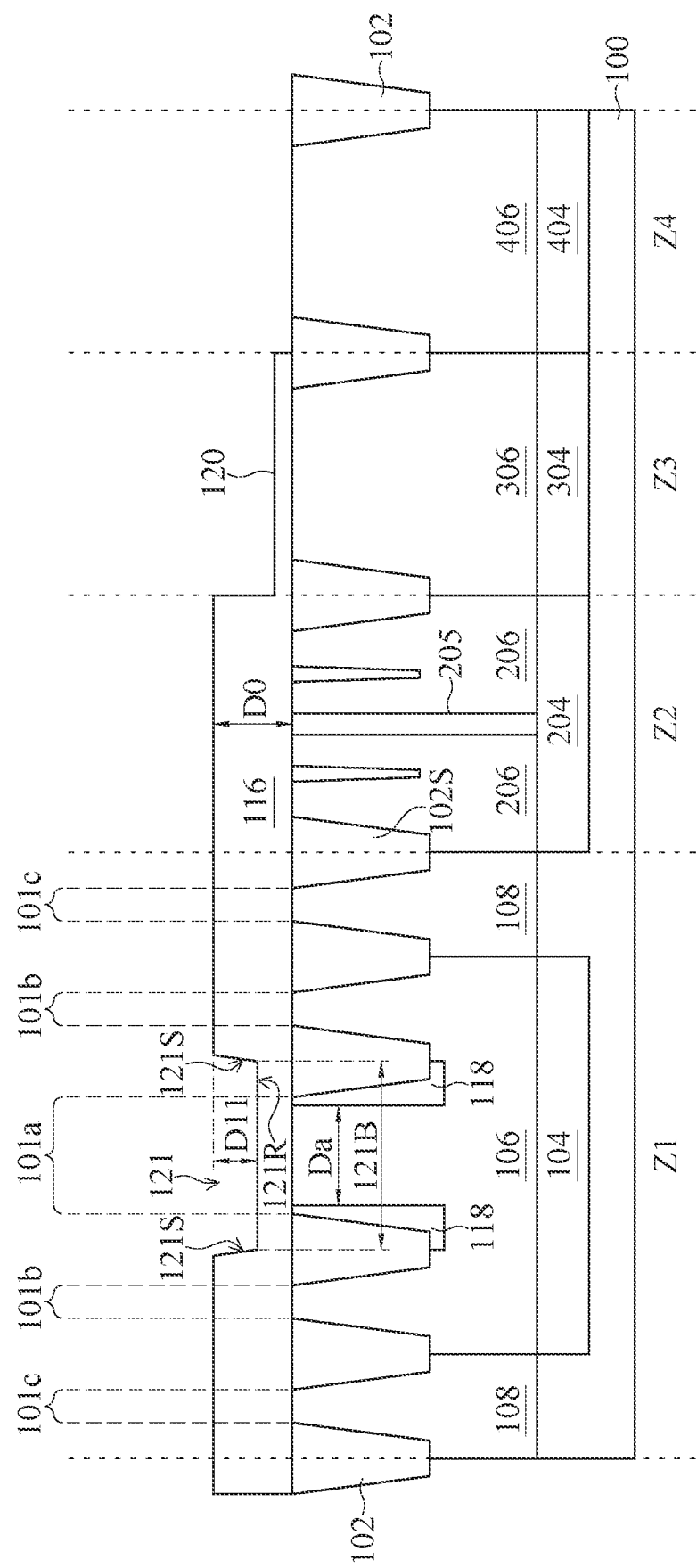
Figure 9C:
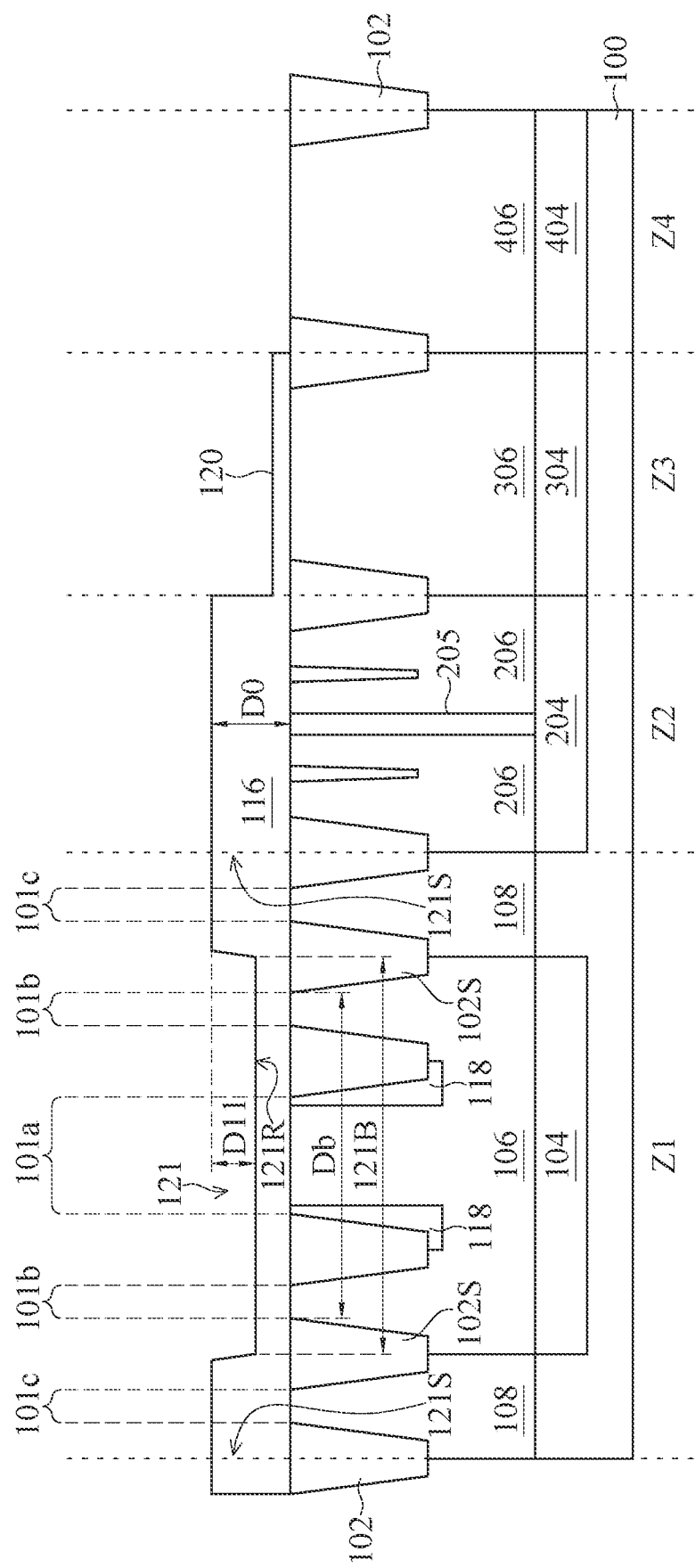
Figure 10:
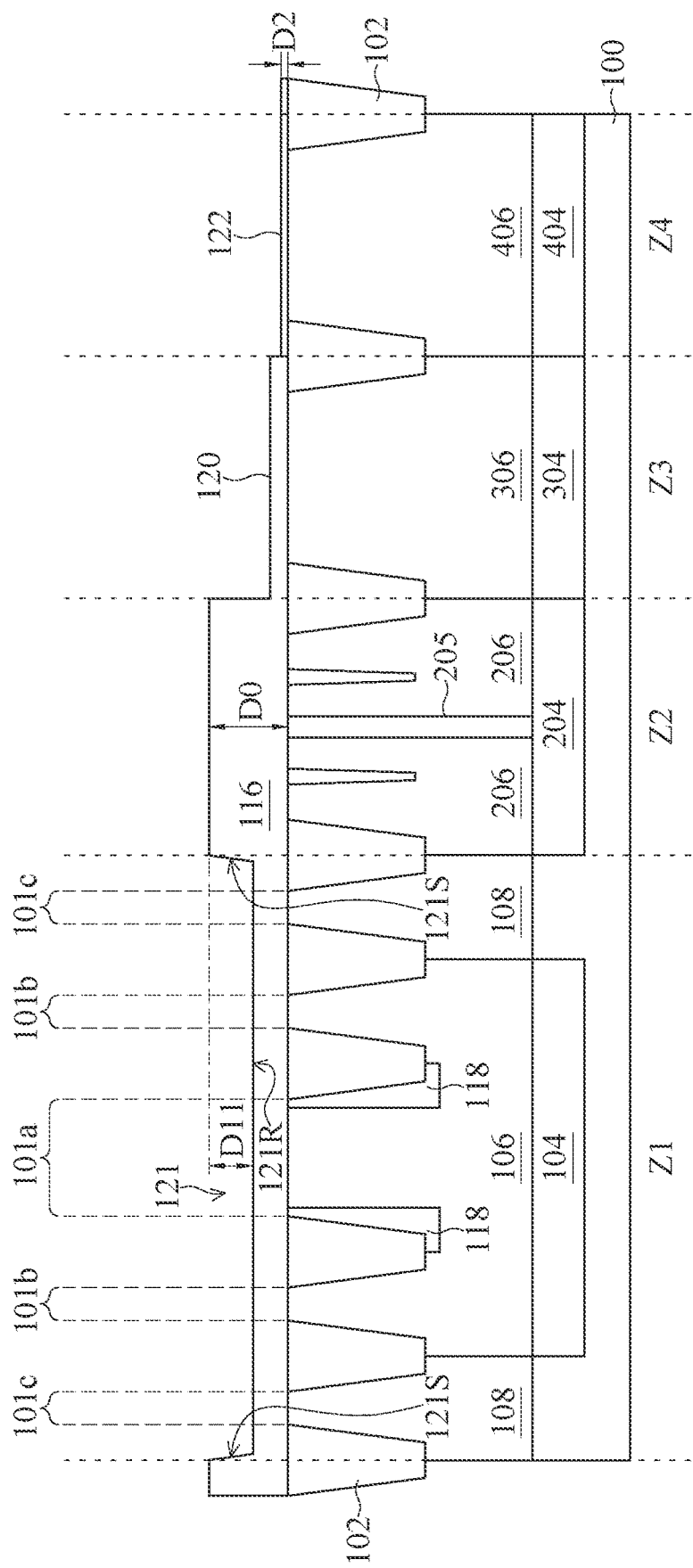

Referring to FIG. 9A, the dielectric layers 116 and 120 are patterned, such that the portions of the dielectric layer 120 covering the fourth device zone Z4 are removed. Further, a portion of the dielectric layer 120 over the first device zone Z1 is also recessed to a depth D11. A recess 121 is thus formed. The depth D11 may be in a range between about 50 Å and about 300 Å, or may be in a range between about 100 Å and about 180 Å, or may be in a range between about 110 Å and about 130 Å. In some embodiments, the recessed depth D11 may be equal to or greater than the thickness D1. The recess 121 may span to cover the anode area 101*a*, the cathode areas 101*b* and the bulk areas 101*c*. The recess 121 has sidewalls 121S formed on the dielectric layer 116 at locations aligned with the isolation regions 102S separating the first device zone Z1 from adjacent device zones. The dielectric layer 116 over the second device zone Z2 and the dielectric layer 120 over the third device zone Z3 remain substantially intact over the substrate 100. In some embodiments, a patterned mask layer is formed over the substrate 100 to expose portions of the dielectric layers 116 and 120 according to the patterned mask layer. The exposed portions are then removed using a dry etch, a wet etch, or an RIE. The patterned mask layer may be stripped after the patterning for the dielectric layers 116 and 120 is completed.

In some embodiments, a ratio of the depth D11 to the thickness D0 of the dielectric layer 116 is greater than zero and less than about 30%. In some embodiments, a ratio of the recessed depth D11 to the thickness D0 of the dielectric layer 116 is between about 10% and about 20%, e.g., about 15%.

FIG. 9A illustrates the sidewalls 121S and an exposed bottom surface 121R of the recess 121 forming an included angle α. In some embodiments, the angle α is greater than or equal to 90°. In some embodiments, the exposed bottom surface 121R is connected to an upper surface 116S of the dielectric layer 116 through a smooth slope (not shown). In some embodiments, the sidewall 121S is aligned with the exposed surface of the bulk areas 101*c* and covers the isolation regions 102S between the first device zone Z1 and other device zones. In some embodiments, the recessed bottom surface 121R has an area extending beyond the third well region 108 of the first device zone Z1. In some embodiments, at least one side of the recess 121 extends beyond the isolation regions 102S at a periphery of the first device zone Z1 such that the sidewall 121S is located within a device zone other than the first device zone Z1.

The recess 121 may be formed with alternative shapes and configurations as shown in FIGS. 9B and 9C. Referring to FIG. 9B, the dielectric layers 116 and 120 are patterned such that the recess 121 spans to cover the anode area 101*a* only, while the portions of the dielectric layer 116 aligned with the cathode areas 101*b* and the bulk areas 101*c* are kept from being etched. The recess 121 in FIG. 9B has sidewalls 121S formed in the dielectric layer 116 at locations aligned with the isolation regions 102S separating the anode areas 101*a* from the cathode areas 101*b*. The dielectric layer 116 over the second device zone Z2 and the dielectric layer 120 over the third device zone Z3 still remain substantially intact over the substrate 100. In some embodiments, the sidewall 121S is aligned with the exposed surface of the anode area 101*a* and the recess 121 covers the entire isolation region 102S between the anode area 101*a* and the cathode area 101*b*. In some embodiments, the exposed bottom surface 121R has a width 121B greater than a width Da of the upper surface of the anode area 101*a* surrounded by the fourth well region 118. The width 121B is determined to be greater than the width Da that, during the patterning operation of the dielectric layer 116, the thickness of the dielectric layer 116 over the anode area 101*a* is sufficiently reduced by the etch such that no residual dielectric layer 116 will be left on the surface of the first region 106 of the Schottky diode device in the first device zone Z1. In some embodiments, the width 121B is greater than about 0.1 µm, e.g., in a range between about 0.1 µm and about 10 µm, a range between about 0.5 µm and about 8 µm, or a range between about 1 µm and about 5 µm.

FIG. 9C illustrates yet another embodiment in which the dielectric layers 116 and 120 are patterned so that the recess 121 is formed to cover the anode area 101*a* and the cathode areas 101*b* only, while the portions of the dielectric layer 116 aligned with the bulk areas 101*c* are kept from being etched. The recess 121 in FIG. 9C has sidewalls 121S formed in the dielectric layer 116 at locations aligned with the isolation regions 102S separating the cathode areas 101*b* from the bulk areas 101*c*. The dielectric layer 116 over the second device zone Z2 and the dielectric layer 120 over the third device zone Z3 still remain substantially intact over the substrate 100. In some embodiments, the sidewall 121S is aligned with the exposed surface of the cathode areas 101b and the recess 121 covers the entire isolation region 102S between the cathode area 101b and the bulk area 101c. In some embodiments, the exposed bottom surface 121R has a width 121B greater than a width Db of the upper surface of the first well region 106 between the adjacent isolation regions 102S. In some embodiments, the exposed bottom surface 121R has a width 121B less than the width Db.

Subsequent to the operation shown in FIG. 9A, another dielectric layer 122 is formed over the fourth device zone Z4. The dielectric layer 122 serves as a gate dielectric layer of a PMOS or an NMOS transistor (not separately shown; a gate structure 408 for such transistor is shown in FIG. 11) in the fourth device zone Z4. In some embodiments, the dielectric layer 122 is formed on the substrate 100 without using a mask, so the dielectric layer 122 extends over the first device zone Z1, the second device zone Z2 and the third device zone Z3 as well. In some embodiments, the dielectric layer 122 covers the entire first well region 406 in the fourth device zone Z4. In some embodiments, the dielectric layer 122 is formed using PVD, CVD, PECVD, LPCVD, APCVD, ALD, spin-on coating, thermally grown process, or any suitable formation process. In some embodiments, the dielectric layer 122 includes silicon oxide. In some embodiments, the dielectric layer 122 is formed of the same material as the dielectric layer 120 or 116.

In some embodiments, the dielectric layer 122 has a thickness D2 suitable for a core transistor operating at a low voltage, and may be below about 50 Å, or between about 10 Å and about 40 Å, or between about 20 Å and about 30 Å. In some embodiments, the thickness D2 of the dielectric layer 122 is less than that of the dielectric layer 116 or 120. In some embodiments, a thickness ratio of D0/D2 is between about 30.0 and about 60.0, or between about 40.0 and about 50.0. In some embodiments, a thickness ratio of D1/D2 is between about 2.0 and about 6.0, or between about 3.0 and about 5.0. Further, given that the materials of the dielectric layer 122 are the same as those of the dielectric layers 116 and 120, the growth rate of the dielectric layer 122 over the dielectric layers 116 and 120 is less than the growth rate of the grown dielectric layer 122 in the fourth device zone Z4 alone. Therefore, the added thickness of the dielectric layer 122 over the dielectric layer 116 or 120 in the respective device zones Z1 to Z3 may be less than the thickness D2 of the dielectric layer 122 in the fourth device zone Z4, and the portion of the dielectric layer 122 in the device zones Z1 to Z3 is therefore omitted from FIG. 10.

Referring to FIG. 11, gate structures are formed in the device zones Z2 to Z4. These gate structures may be metal gate structures or sacrificial gate structures for forming the transistor devices in the device zones Z2 to Z4. For example, a gate structure 208 is formed including a gate electrode 212 and sidewall spacers 214 over the dielectric layer 116. Similarly, a gate structure 308 is formed including a gate electrode 312 and sidewall spacers 314 over the dielectric layer 120, and a gate structure 408 is formed including a gate electrode 412 and sidewall spacers 414 over the dielectric layer 122.

In some embodiments, the gate electrode 212, 312 or 412 may include a stack formed of an oxide layer, a nitride layer and a hard mask layer for a sacrificial gate structure, or may include a stack formed of a glue layer, a capping layer, one or more work function tuning layers and a conductive filling layer for a metal gate structure. In some embodiments, the gate electrodes 212, 312 or 412 are formed by deposition of a stack of layers using CVD, PVD, ALD, or other suitable deposition processes, and etching of the stack of layers into the shape of the gate electrode as desired using a dry etch, a wet etch or a combination thereof.

In some embodiments, the sidewall spacers 214, 314 or 414 may be formed of dielectric materials, such as oxide, nitride, oxynitride, carbide, high-k dielectric materials, combinations thereof, or the like. In some embodiments, the sidewall spacers 214, 314 or 414 are formed by forming a dielectric material in a conformal manner on the top surface and along sidewalls of the respective gate electrodes 212, 312 and 412, and performing an etching operation to remove the horizontal portions of the dielectric material to thereby leave the vertical portions along the sidewalls of the respective gate electrodes. In some embodiments, the etching operation for forming the sidewall spacers 214, 314 and 414 is an anisotropic etch.

In some embodiments, during the etching operation for patterning the gate electrodes 212, 312 and 412 and the sidewall spacers 214, 314 and 414, portions of the dielectric layers 116, 120 and 122 may be etched. For example, the dielectric layer 122 may be patterned during the etching operation such that portions of the dielectric layer 122 covered by the gate structure 408 remain while the other portions are removed and the surface 100S is exposed. The portions of the dielectric layer 122 that are left below the gate electrode 412 acts as the gate dielectric layer of the gate structure 408. In some embodiments, portions of the dielectric layer 116 or 120 in the respective device zone Z2 or Z3 that are not covered by the gate electrode 212 or 312 are thinned by the spacer etching operation. In some embodiments, the dielectric layer 120 is further patterned such that the portions of the dielectric layer 120 not covered by the gate electrode 312 are further removed and the surface 100S is exposed. Therefore, portions of the dielectric layer 120 left below the gate electrode 312 acts as the gate dielectric layer of the gate structure 308.

Figure 12:
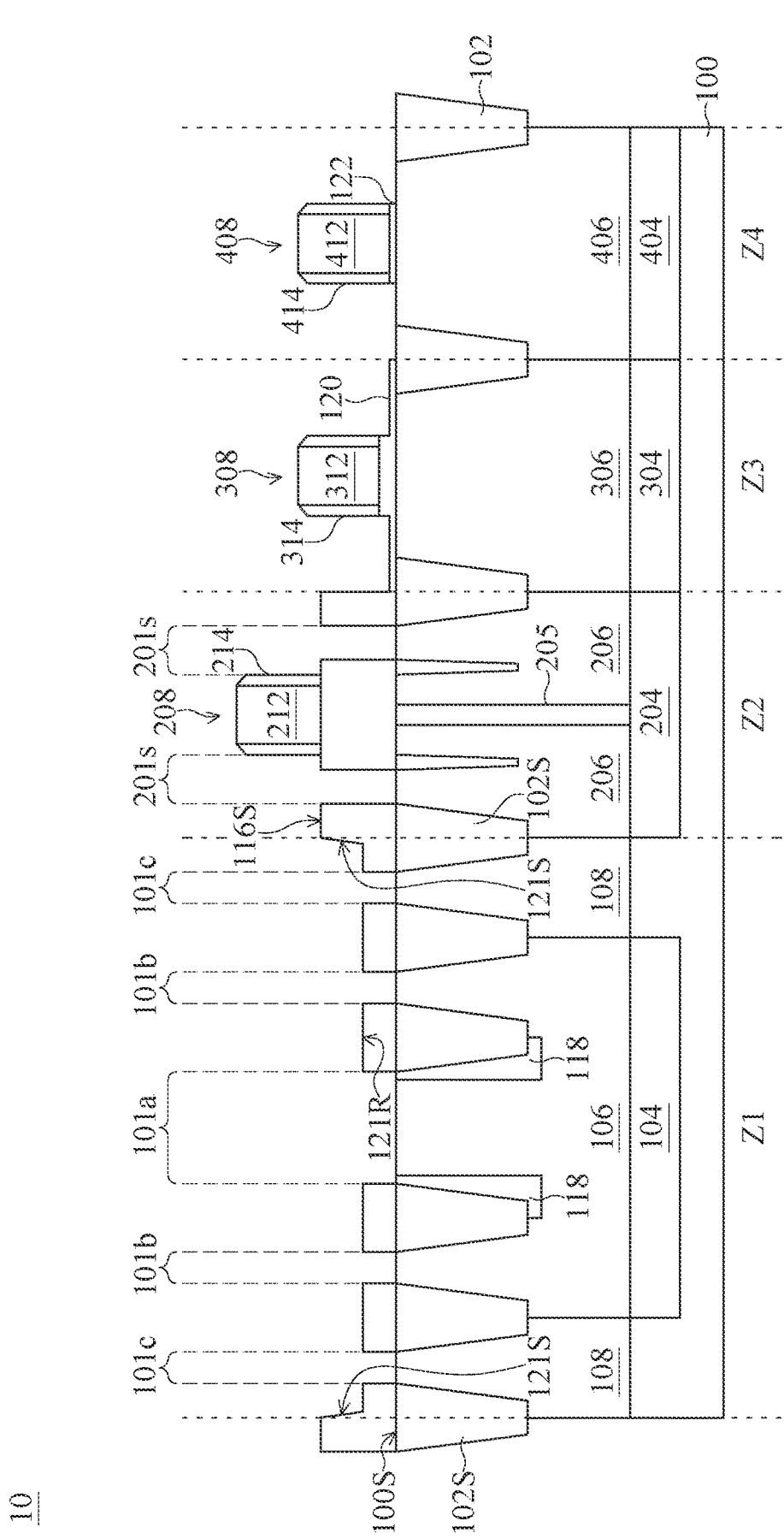

FIG. 12 illustrates the patterning of the dielectric layer 116 in the embodiment shown in FIG. 9A. In some embodiments, the dielectric layer 116 is patterned such that openings are formed to expose the surface 100S in the anode area 101a of the first well region 106 in the first device zone Z1. In some embodiments, the dielectric layer 116 is patterned to form openings that expose the surface 100S in the cathode area 101b of the first well region 106. In some embodiments, the dielectric layer 116 is patterned to form openings that expose the surface 100S in the bulk area 101c of the third well region 108. In addition, the dielectric layer 116 is patterned to expose source/drain regions 201S of the transistors in the second device zone Z2. The portions of the patterned dielectric layer 116 below the gate electrode 212 acts as the gate dielectric layer of the gate structure 208. The gate structure 208 may serve as an etch mask during the patterning operation to expose the source/drain regions 201S. In some embodiments, the openings formed through the patterning operation may have areas greater or less than the exposed anode and cathode areas 101a and 101b in the first well region 106 or the exposed bulk area 101c in the third well region 108. In some embodiments, the patterning operation still leaves a portion of the anode area 101a, cathode area 101b or bulk area 101c covered by the dielectric layer 116. In some embodiments, the patterned dielectric layer 116 is over-etched and exposes a portion of the underlying isolation regions 102. In some embodiments, the patterning operations of the dielectric layer 116 in the first device zone Z1 and in the second device zone Z2 are performed using a single etching process. In some embodiments, the dielectric layer 116 is patterned using a photolithography/etching process, a laser drilling process or another suitable material removal process.

The patterning operation forms a pattern in the dielectric layer 116 following the pattern of the underlying isolation regions 102. In some embodiments, the dielectric layer 116 includes a stepped shape or a smooth slope at locations at the periphery of the first device zone Z1. The sidewalls 121S of the stepped shape or the slope of the dielectric layer 116 face the inner area (e.g., the anode area 101*a*) of the first device zone Z1. In some embodiments, the upper surface of the patterned dielectric layer 116 includes a higher level and a lower level, in which the higher level and the lower level are represented by the un-etched upper surface 116S and the recessed bottom surface 121R, respectively. In some embodiments, the higher level 116S laterally surrounds the lower level 121R in a plan view. In some embodiments, the higher level 116S of the patterned dielectric layer 116 is connected to the lower level 121R of the dielectric layer 116 through the slope. In some embodiments, the dielectric layer 116 includes the stepped shape or the slope at locations aligned with the sidewalls 121S, as illustrated in FIGS. 9A to 9C. Such stepped shape or slope left in the patterned dielectric layer 116 is caused by a two-step patterning operation as illustrated in FIG. 9A (or, alternatively, FIGS. 9B and 9C) and 12. With such two-step patterning operation, the relatively thick dielectric layer 116 in the anode area 101*a*, and optionally in the cathode areas 101*b* or the bulk areas 101*c*, can be completely removed. Moreover, no extra etching operations are required to accomplish the two-step patterning since both of the two patterning operations are performed along with other patterning operations on at least one of the device zones Z2 to Z4. The processing cost and time can thus be reduced.

The patterning of the dielectric layer 116 is performed to ensure complete removal of the dielectric material of the dielectric layer 116 from the surface 100S of the anode area 101*a* for improving the performance of the SBD device. In some embodiments, portions of the dielectric layer 116 are subject to a single patterning operation in FIG. 12 instead of the two-step patterning operation, and thus residues of the dielectric layer 116 may be left on the surface 100S of the cathode area 101*b* or the bulk area 101*c*. For example, a bump 116R (shown in FIG. 15) is formed in the opening of the cathode area 101*b* (or in the bulk area 101*c*, although not shown) and leaves a portion of the substrate 100 exposed. Alternatively, a residual layer 116T (shown in FIG. 15) is formed in the opening of the bulk area 101*c* (or in the cathode area 101*b*, although not shown) and covers the substrate 100. In some embodiments, the patterning of the dielectric layer 116 completely removes the residues so that no residues are left on the surface 100S in the cathode areas 101*b* or bulk areas 101*c*.

Figure 13:
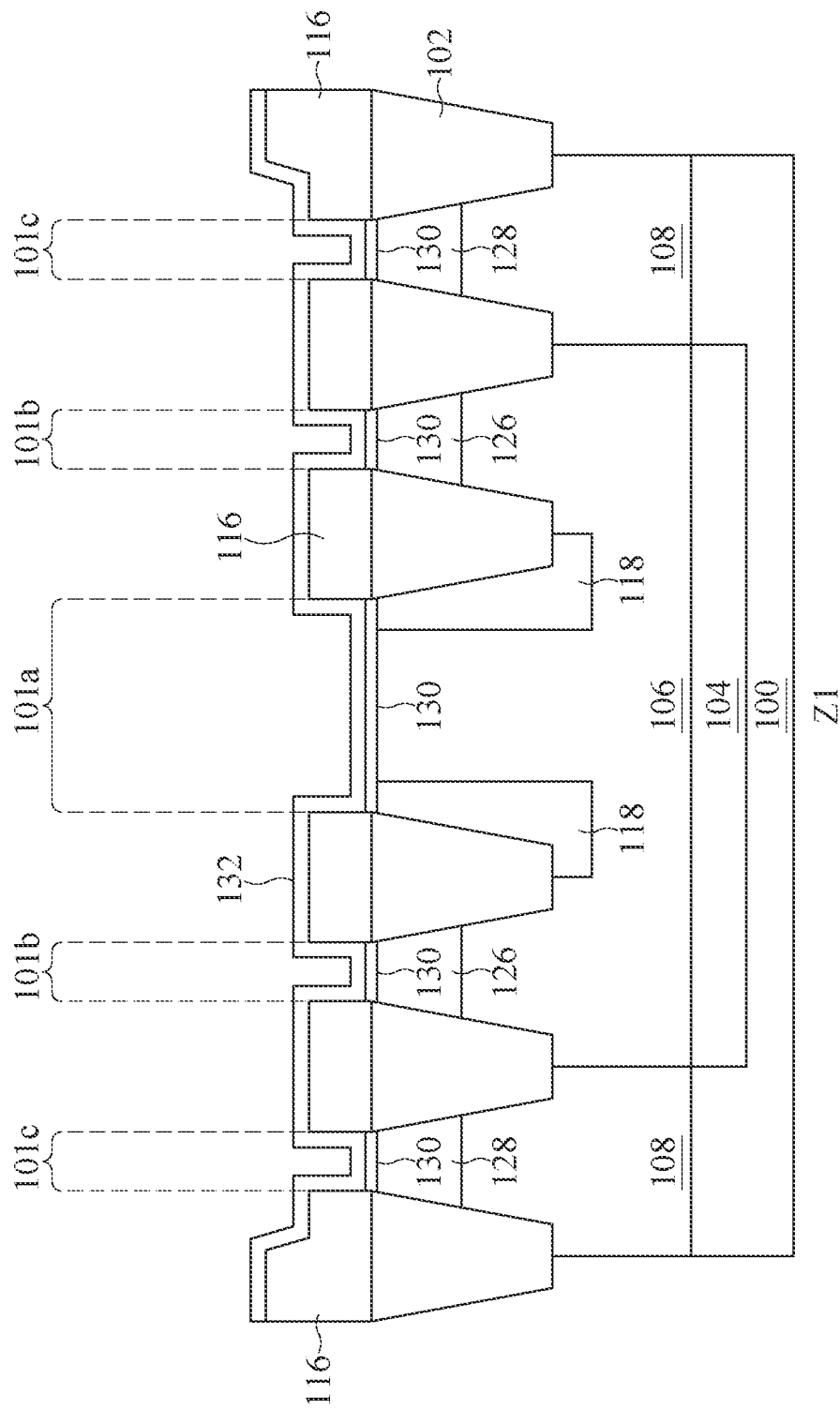

FIG. 13 illustrates a zoomed-in cross-sectional view of the first device zone Z1 for subsequent processes. A heavily-doped layer 126 is formed in the cathode areas 101*b* of the first well region 106. The heavily-doped layer 126 can aid in enhancing the electrical properties of the SBD device, such as reducing the contact resistance of a cathode terminal of the SBD device. The heavily-doped layer 126 contains dopants of the first conductivity type, such as n-type dopants, with a dopant concentration greater than that of the first well region 106. The heavily-doped layer 126 may be formed through an ion implantation operation and the implantation dose may be between about 1E15 atoms/cm$^3$ and about 1E17 atoms/cm$^3$. In some embodiments, a portion (not shown) of the heavily-doped layer 126 serves as a doped region of an NMOS or a PMOS transistor in the device zones Z2 to Z4. For example, heavily doped n-type regions are formed in an NMOS transistor of the second device zone Z2 as the source/drain regions during the formation of the heavily-doped layer 126.

In some embodiments, another heavily-doped layer 128 is formed in the bulk areas 101*c* of the first well region 106. The heavily-doped layer 128 can aid in enhancing the electrical properties of the SBD device, such as reducing the contact resistance of a bulk terminal of the SBD device. The heavily-doped layer 128 contains dopants of the second conductivity type, such as p-type dopants, with a dopant concentration greater than that of the third well region 108. The heavily-doped layer 128 may be formed through an ion implantation operation, and the implantation dose may be between about 1E15 atoms/cm$^3$ and about 1E17 atoms/cm$^3$. In some embodiments, a portion (not shown) of the heavily-doped layer 128 serves as a doped region of an NMOS or a PMOS transistor in the device zones Z2 to Z4. For example, heavily doped p-type regions are formed in a PMOS transistor of the second device zone Z2 as the source/drain regions during the formation of the heavily-doped layer 128.

Subsequently, a conductive layer, such as a silicide layer, 130 is formed on the exposed surfaces 100S in the anode area 101*a*, the cathode areas 101*b* and the bulk areas 101*c*. In some embodiments, the silicide layer 130 is formed over the heavily-doped layers 126 and 128. The silicide layer 130 is formed in contact with the exposed surface 100S of the anode area 101*a*. Further, the silicide layer 130 may be formed in contact with the exposed cathode areas 101*b* and the exposed bulk areas 101*c*. In some embodiments, the silicide layer 130 may include cobalt silicide, titanium silicide, tungsten silicide, nickel silicide, or the like. An exemplary process for fabricating the silicide layer 130 includes forming a metal-containing layer (not shown) to cover the substrate 100 and the dielectric layer 116. In the present embodiment, the metal-containing layer includes cobalt, but in other embodiments the metal-containing layer may also include titanium, tungsten, nickel or a combination thereof. An annealing process is performed on the metal-containing layer to cause reaction of the metal with silicon in the substrate 100 to form a silicide material of the silicide layer 130. In some embodiments, portions of the metal-containing layer on the dielectric layer 116 that do not react with silicon are removed after the silicide layer 130 is formed.

A dielectric layer 132 is deposited over the dielectric layer 116, the exposed portions of the fourth well region 118 and the silicide layer 130. The dielectric layer 132 may be formed as a contact etch stop layer (CESL) for subsequent processes. In some embodiments, the dielectric layer 132 includes dielectric materials such as silicon nitride, silicon oxynitride, silicon carbon nitride, any other suitable insulating material or a combination thereof. In some embodiments, the dielectric layer 132 is formed using PVD, CVD, ALD, spin-on coating, thermally grown process or other suitable formation process.

Figure 14:
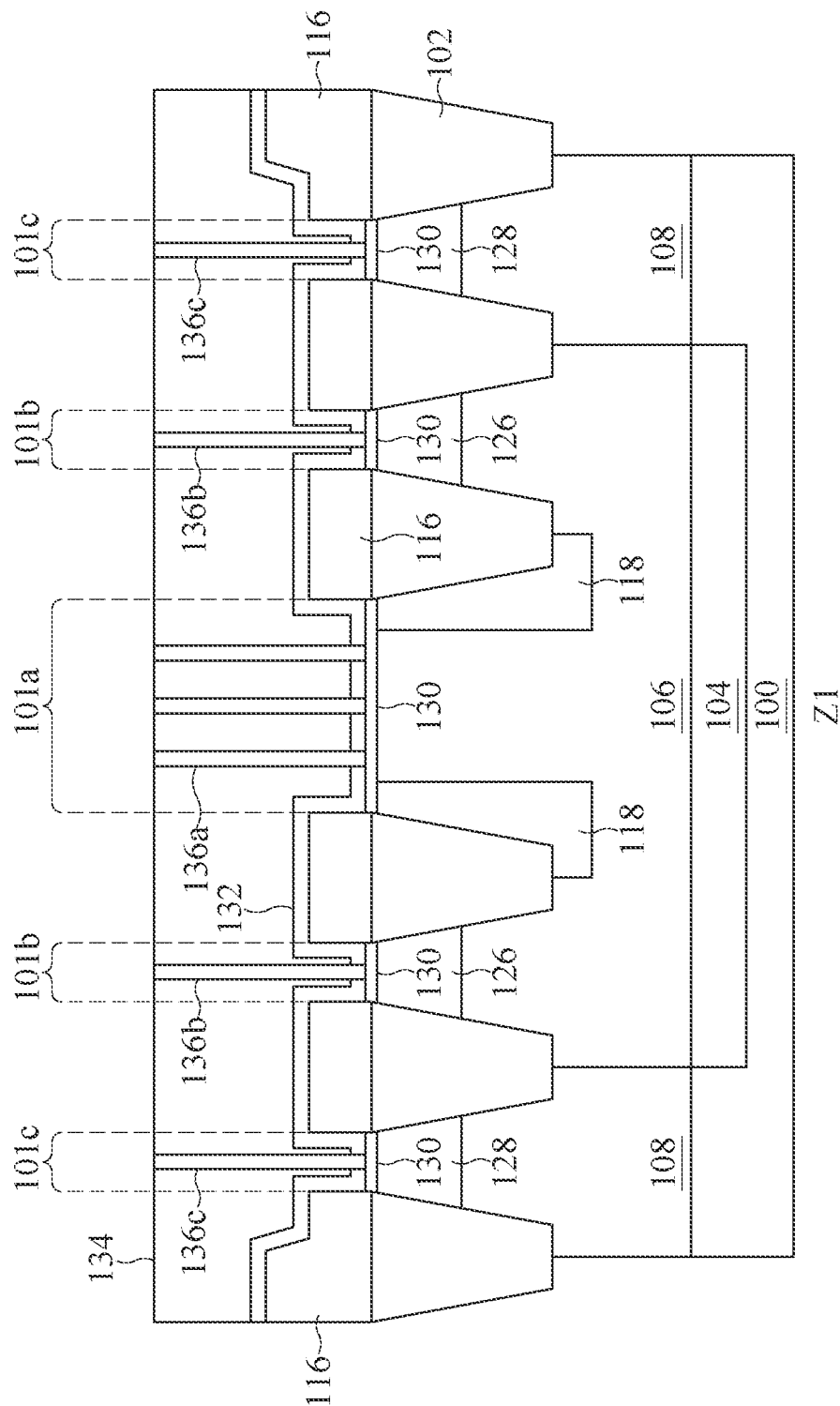

Referring to FIG. 14, an inter-layer dielectric (ILD) layer 134 is formed over the contact etch stop layer 132. In some embodiments, the ILD layer 134 includes oxide, oxynitride, silicon nitride, nitrogen-bearing oxide, nitrogen-doped oxide, silicon oxynitride, polymer, any other suitable insulating material or a combination thereof. In some embodiments, the ILD 134 is formed using PVD, CVD, ALD, spin-on coating or other deposition process. The ILD layer 134 is subsequently patterned such that through holes are formed through the ILD layer 134 to expose portions of the silicide layer 130 in the anode area 101*a*, the cathode areas 101*b* and the bulk areas 101*c*. Conductive materials are formed in these through holes to form conductive plugs 136 that electrically couple the underlying anode areas 101*a*, cathode areas 101*b* and bulk areas 101*c* to features in the overlying layers. For example, conductive plugs 136*a* are electrically coupled to the anode area 101*a*, and conductive plugs 136*b* and 136*c* are electrically coupled to the cathode areas 101*b* and bulk areas 101*c*, respectively. The conductive plugs 136 have a multiplayer structure and may be formed of one or more materials, such as titanium, titanium nitride and tungsten in the present embodiment, while other metallic elements such as tantalum, tantalum nitride, copper, copper alloys, nickel, tin, gold, or combinations thereof, may also be used in other embodiments. In some embodiments, a titanium layer is formed as a glue layer of the conductive plug 136 to bond the underlying silicide layer 130 to the remaining layers of the conductive plug 136.

FIGS. 15 to 17 illustrate another embodiment that follows the operations in FIGS. 1 to 8, 9B (or, alternatively, FIGS. 9C), 10 and 11. As discussed previously, the two-step patterning of the dielectric layer 116 is performed to ensure complete removal of the dielectric material of the dielectric layer 116 from the surface 100S of the anode area 101*a* for improving the performance of the SBD device. Referring to FIG. 9B, the portions of the dielectric layer 116 in the cathode areas 101*b* and the bulk areas 101*c* are not thinned by the patterning operation. Such non-thinned thickness may make it difficult to form openings of the dielectric layer 116 using a single patterning operation and without leaving residues in the openings. In some embodiments, residues of the dielectric layer 116 may be left on the surface 100S of the cathode area 101*b* or the bulk area 101*c*. For example, a bump 116R is formed in the opening of the cathode area 101*b* (or in the bulk area 101*c*, although not shown) and leaves a portion of the substrate 100 exposed. Alternatively, a residual layer 116T is formed in the opening of the bulk area 101*c* (or in the cathode area 101*b*, although not shown) and covers the entire substrate 100. In another embodiment, in which the operation in FIG. 9B is replaced by that in FIG. 9C, the recess 121 does not extend to the bulk areas 101*c*. Therefore, the bump 116R or the residual layer 116T may be formed in the bulk areas 101*c* during the patterning operation in FIG. 15.

FIG. 16 illustrates the formation of the heavily-doped layers 126 and 128, the silicide layer 130 and the ILD layer 132 following the operations of FIG. 15. The materials, configurations and method of formation for the heavily-doped layers 126 and 128, the silicide layer 130 and the ILD layer 132 are similar to those described with reference to FIG. 13. In embodiments where residues (e.g., the bump 116R or thin layer 116T in FIG. 15) of the dielectric layer 116 are left on the surface 100S, the silicide layer 130 may not be successfully formed on the surface 100S due to such residues. Such residues block silicon from reacting with the metal-containing layer and therefore the silicide layer 130 is partially formed or absent where the residues exist.

FIG. 17 illustrates the formation of the ILD layer 134 and the conductive plugs 136 following the operations of FIG. 16. The materials, configurations and method of formation for ILD layer 134 and the conductive plugs 136 are similar to those described with reference to FIG. 14.

In some embodiments, before forming the conductive plugs 136 in the through holes of the ILD layer 134, a pre-clean process may be performed to remove undesired particles, contaminants, or material residues including the residues of the dielectric layer 116 from the through holes. The pre-clean process may be conducted using a wet etch operation to facilitate removal of these undesired materials from the surface 100S. As such, if there are residues left on the surface 100S and these residues are exposed by the through holes, they will be further removed by the pre-clean process. In the meantime, the silicide layer 132 may be left in place during the pre-clean process. Referring to FIG. 17, the pre-clean process generates an opening in the silicide layer 130 aligned with the conductive plug 136*b* in the right-hand cathode area 101*b*. Similarly, the pre-clean process generates an opening in the thin layer 116T aligned with the conductive plug 136*c* in the right-hand bulk area 101*c*. As a result, the subsequently-formed conductive plugs 136*b* and 136*c* may be in direct contact with the underlying heavily-doped layers 126 and 128, respectively. Since such openings exist in the cathode area 101*b* or the bulk areas 101*c* due to the unsuccessful removal of the dielectric layer 116, the SBD performance may not be significantly degraded. That is because the interface between the cathode areas 101*b* (or the bulk areas 101*c*) and their underlying first well region 106 (or third well region 108) is formed as an ohmic contact and the electric properties of the SBD device will not be adversely affected.

Nevertheless, in some existing methods, if such opening of the silicide layer 130 exists in the anode area 101*a*, the first well region 106 will contact the conductive plugs 136*a* through such opening and at least a portion of the Schottky barrier interface will be established by a conductive material (e.g., titanium) in the conductive plug 136*a*, and will not be established by the silicide layer 130 (such as cobalt silicide). Since the work function of the conductive material of the conductive plug 136*a* may be less than the work function of the silicide layer, the Schottky barrier height obtained by the conductive materials of the conductive plugs 136*a* and the first well region 106 is less than the Schottky barrier height formed by the silicide layer 130 and the first well region. The leakage current performance of the SBD device may be reduced accordingly. In contrast, with the proposed two-step patterning scheme for the dielectric layer 116 that is used to completely remove residues of the dielectric layer 116 in the anode area 101*a* before formation of the conductive plugs 136*a*, the surface 100S will be completely covered by the silicide layer 130, no openings will be generated during the formation of the conductive plugs 136*a*, and the metal side of the Schottky barrier interface will be formed of the silicide layer 130 only. The leakage current performance can thus be improved.

Figure 18:
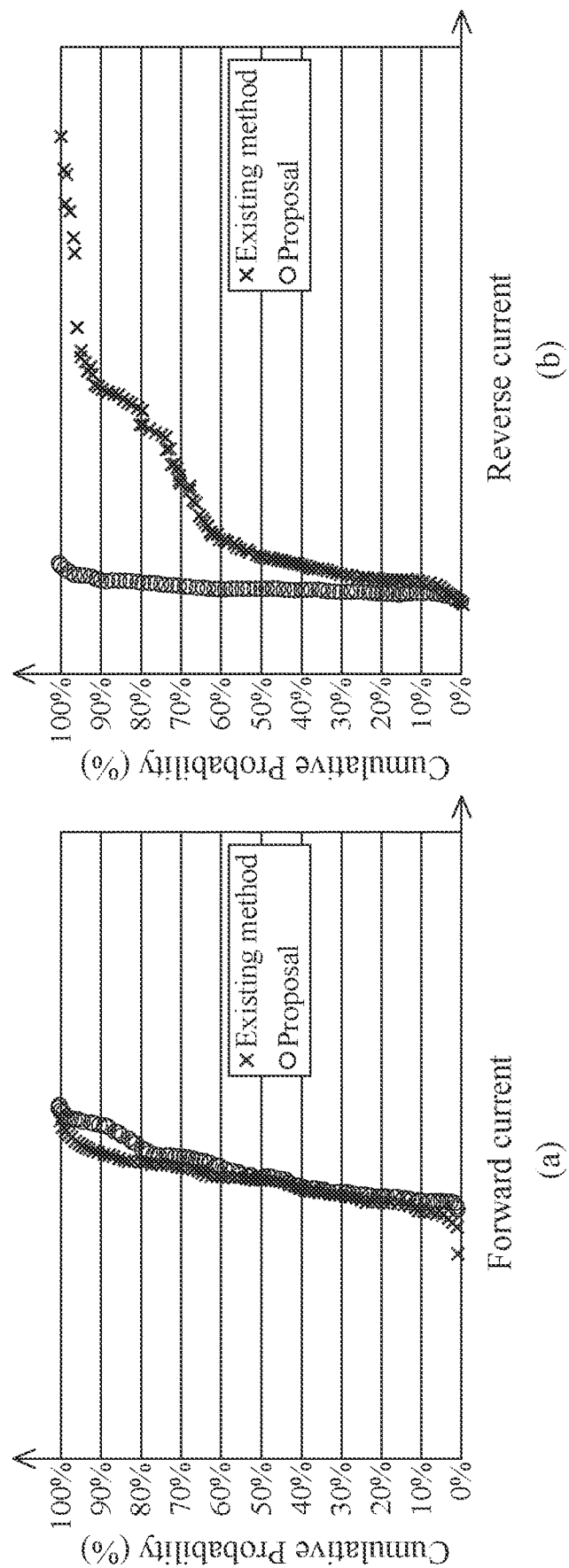
FIG. 18 shows plots illustrating the performance of a Schottky barrier diode device, in accordance with some embodiments.

FIG. 18 shows plots illustrating the performance of an SBD device, in accordance with some embodiments. Plot (a) and plot (b) show the forward current and leakage current under the forward-biased mode and the reversed-biased mode, respectively, of the SBD device in terms of the cumulative probabilities of current measurements. The proposal using the two-step patterning scheme as illustrated in FIG. 9A (or, alternatively, FIGS. 9B and 9C) and 12 is compared to an existing one-step patterning scheme in which the dielectric layer 116 is patterned by a single patterning operation of FIG. 12. The current measurements of plots (a) and (b) illustrate that even though the proposed scheme method performs only slightly better than the existing method in terms of forward current measurements under the forward-biased mode, the leakage current performance of the proposed scheme is significantly superior to that of the existing method.

According to an embodiment, a semiconductor device includes a first well region in a substrate; a first dielectric layer over the first well region, wherein the first dielectric layer includes a stepped shape over the first well region; and a conductive layer over the first well region. The conductive layer forms a Schottky barrier interface with the first well region.

According to an embodiment, a semiconductor device includes: a first well region and a second well region in a substrate, the second well region including a transistor; a dielectric layer arranged over the first well region and the second well region, wherein the dielectric layer has a first thickness in a first portion over the first well region and a second portion of the second well region, and a second thickness, less than the first thickness, in a third portion of the first well region; and a silicide layer on an exposed surface of the first well region to form a Schottky barrier interface with the first well region.

According to an embodiment, a semiconductor device includes a first well region and a second well region in a substrate; a dielectric layer over the first well region and the second well region; a conductive plug over the dielectric layer in the first well region; a gate structure over the dielectric layer in the second well region; and a silicide layer between the first well region and the conductive plug. The dielectric layer is configured as a gate dielectric layer of the gate structure in the second well region, and has a first upper surface, in the first well region, level with a second upper surface of the dielectric layer in the second well region, wherein the dielectric layer further has a third upper surface less than the first upper surface in the first well region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first well region in a substrate;
a first dielectric layer over the first well region, wherein the first dielectric layer includes a stepped shape over the first well region;
a second well region in the substrate, wherein the first dielectric layer comprises a portion directly over the second well region and configured as a gate dielectric layer of a transistor device in the second well region; and
a conductive layer over the first well region, the conductive layer forming a Schottky barrier interface with the first well region.

2. The semiconductor device of claim 1, the conductive layer comprises silicide.

3. The semiconductor device of claim 1, further comprising a conductive plug electrically coupled to the conductive layer.

4. The semiconductor device of claim 1, wherein the stepped shape includes a first thickness directly over the second well region greater than a second thickness directly over the first well region.

5. The semiconductor device of claim 1, wherein the stepped shape includes a first surface higher than an upper surface of the first well region and a second surface higher than the first surface.

6. The semiconductor device of claim 1, further comprising a second well region in the substrate, wherein the stepped shape of the first dielectric layer is arranged at a boundary between the first well region and the second well region.

7. The semiconductor device of claim 1, wherein the stepped shape include a recessed surface over the Schottky barrier interface.

8. The semiconductor device of claim 7, wherein a ratio between a depth of the recessed surface and a thickness of the first dielectric layer is less than about 30%.

9. The semiconductor device of claim 1, further comprising a second dielectric layer arranged over the first dielectric layer and the conductive layer in a conformal manner.

10. The semiconductor device of claim 1, further comprising a third well region in the first well region and including a conductivity type opposite to that of the first well region.

11. The semiconductor device of claim 10, wherein the third well region includes a ring shape from a plan view.

12. The semiconductor device of claim 11, further comprising isolation regions in the first well region and defining the Schottky barrier interface, wherein the isolation regions laterally surround the third well region.

13. A semiconductor device, comprising:
a first well region and a second well region in a substrate, the second well region including a transistor;
a dielectric layer arranged over the first well region and the second well region, wherein the dielectric layer has a first thickness in a first portion over the first well region and a second portion of the second well region, and a second thickness, less than the first thickness, in a third portion of the first well region;
a silicide layer on an exposed surface of the first well region to form a Schottky barrier interface with the first well region, wherein the Schottky barrier interface is configured as an anode area of a Schottky diode; and
a third well region in the first well region adjacent to the anode area and configured as a cathode area of the Schottky diode.

14. The semiconductor device of claim 13, wherein the third well region having a conductivity type the same as that of the first well region.

15. The semiconductor device of claim 13, wherein the third well region has a doping concentration greater than the first well region.

16. The semiconductor device of claim 13, wherein the first thickness is arranged in the anode area and the second thickness is arranged in the cathode area.

17. The semiconductor device of claim 13, further comprising isolation regions in the first well region and defining the Schottky barrier interface, wherein the isolation regions have a depth less than the first well region.

18. A semiconductor device, comprising:
a first well region and a second well region adjacent to the first well region in a substrate;
a third well region directly over the first well region in the substrate;
a dielectric layer over the first well region and the second well region;
a conductive plug over the dielectric layer in the first well region;
a gate structure over the dielectric layer in the second well region; and
a silicide layer between the first well region or the third well region and the conductive plug, wherein the first well region and the third well region are configured as an anode area and a cathode area, respectively, of a Schottky diode,
wherein the dielectric layer is configured as a gate dielectric layer of the gate structure in the second well region, and has a first upper surface, in the first well region, level with a second upper surface of the dielectric layer in the second well region, wherein the dielectric layer further has a third upper surface less than the first upper surface in the first well region.

19. The semiconductor device of claim 18, wherein the silicide layer forms a Schottky barrier interface with the first well region in the anode area, wherein the dielectric layer has a recessed surface aligned with the anode area.

20. The semiconductor device of claim 18, further comprising an isolation region in the first well region, wherein the dielectric layer includes a step directly over the isolation region.

\* \* \* \* \*